United States Patent
Kamimura et al.

(10) Patent No.: US 12,253,801 B2
(45) Date of Patent: *Mar. 18, 2025

(54) SOLUTION, SOLUTION STORAGE BODY, ACTINIC RAY-SENSITIVE OR RADIATION-SENSITIVE RESIN COMPOSITION, PATTERN FORMING METHOD, AND MANUFACTURING METHOD OF SEMICONDUCTOR DEVICE

(71) Applicant: FUJIFILM Corporation, Tokyo (JP)

(72) Inventors: Tetsuya Kamimura, Haibara-gun (JP); Satomi Takahashi, Haibara-gun (JP); Yukihisa Kawada, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 629 days.

This patent is subject to a terminal disclaimer.

(21) Appl. No.: 16/273,323

(22) Filed: Feb. 12, 2019

(65) Prior Publication Data

US 2019/0171102 A1     Jun. 6, 2019

Related U.S. Application Data

(63) Continuation of application No. PCT/JP2017/031514, filed on Sep. 1, 2017.

(30) Foreign Application Priority Data

Sep. 2, 2016    (JP) ................................ 2016-172244
Aug. 30, 2017   (JP) ................................ 2017-166085

(51) Int. Cl.
| | | |
|---|---|---|
| *G03F 7/004* | (2006.01) | |
| *G03F 1/66* | (2012.01) | |
| *G03F 7/00* | (2006.01) | |
| *G03F 7/038* | (2006.01) | |
| *G03F 7/16* | (2006.01) | |
| *G03F 7/32* | (2006.01) | |
| *H01L 21/027* | (2006.01) | |

(52) U.S. Cl.
CPC ............ *G03F 7/0048* (2013.01); *G03F 1/66* (2013.01); *G03F 7/0012* (2013.01); *G03F 7/038* (2013.01); *G03F 7/16* (2013.01); *G03F 7/325* (2013.01); *G03F 7/70033* (2013.01); *H01L 21/027* (2013.01)

(58) Field of Classification Search
CPC ........ G03F 7/0048; G03F 7/325; G03F 7/423; G03F 7/421
See application file for complete search history.

(56) References Cited

U.S. PATENT DOCUMENTS

| | | | | |
|---|---|---|---|---|
| 4,308,338 A | * | 12/1981 | Chambers | ............... G03F 7/031 430/188 |
| 5,773,403 A | * | 6/1998 | Hijino | ..................... C23G 5/032 134/40 |
| 11,573,489 B2 | * | 2/2023 | Kamimura | ............... G03F 7/168 |
| 11,740,557 B2 | * | 8/2023 | Kamimura | ................ G03F 7/16 510/175 |
| 11,747,727 B2 | * | 9/2023 | Kamimura | ............ G03F 7/0397 430/324 |
| 2005/0065060 A1 | | 3/2005 | Kin et al. | |
| 2008/0153732 A1 | * | 6/2008 | Iwamoto | ................ C11D 7/267 510/505 |
| 2009/0155713 A1 | | 6/2009 | Miyano et al. | |
| 2015/0227049 A1 | * | 8/2015 | Yamanaka | ................ G03F 7/32 206/524.2 |
| 2017/0145311 A1 | * | 5/2017 | Liu | ................... H01L 21/30608 |
| 2017/0168391 A1 | | 6/2017 | Yoshida et al. | |

FOREIGN PATENT DOCUMENTS

| | | |
|---|---|---|
| JP | 09-49000 A | 2/1997 |
| JP | 2007-171466 A | 7/2007 |
| JP | 2011-170151 A | 9/2011 |
| JP | 2016-014116 A | 1/2016 |
| KR | 10-2008-0072099 A | 8/2008 |
| TW | 201423289 A | 6/2014 |
| WO | 2016/035819 A1 | 3/2016 |

OTHER PUBLICATIONS

Communication dated Jan. 27, 2021 from the Taiwanese Patent Office in Application No. 106129951.
Communication dated Sep. 3, 2019, from the Japanese Patent Office in counterpart application No. 2018-537424.
International Search Report issued Nov. 28, 2017 in International Application No. PCT/JP2017/031514.
Written Opinion issued Nov. 28, 2017 in International Application No. PCT/JP2017/031514.
English Translation of International Preliminary Report on Patentability issued Mar. 5, 2019 in International Application No. PCT/JP2017/031514.
Communication dated Jul. 29, 2020, issued by the Korean Intellectual Property Office in Korean Application No. 10-2019-7005325.

(Continued)

*Primary Examiner* — Daborah Chacko-Davis
(74) *Attorney, Agent, or Firm* — Sughrue Mion, PLLC

(57) ABSTRACT

An object of the present invention is to provide a solution which is excellent in both the temporal stability of an organic solvent and the defect inhibition properties. Another object of the present invention is to provide a solution storage body storing the solution, an actinic ray-sensitive or radiation-sensitive resin composition containing the solution, and a pattern forming method and a manufacturing method of a semiconductor device using the solution.

The solution of the present invention is a solution containing an organic solvent and a stabilizer, in which a content of the stabilizer with respect to a total mass of the solution is 0.1 to 50 mass ppm.

22 Claims, No Drawings

(56) References Cited

OTHER PUBLICATIONS

Communication dated Aug. 31, 2021 from the Taiwanese Intellectual Property Office in TW application No. 106129951.
Office Action dated Jul. 25, 2023, from the Taiwanese Intellectual Property Office in TW Application No. 111114568.
Taiwanese Office Action issued Feb. 16, 2024 in Taiwanese Application No. 111114568.

* cited by examiner

SOLUTION, SOLUTION STORAGE BODY, ACTINIC RAY-SENSITIVE OR RADIATION-SENSITIVE RESIN COMPOSITION, PATTERN FORMING METHOD, AND MANUFACTURING METHOD OF SEMICONDUCTOR DEVICE

CROSS-REFERENCE TO RELATED APPLICATIONS

This application is a Continuation of PCT International Application No. PCT/JP2017/031514 filed on Sep. 1, 2017, which claims priority under 35 U.S.C. § 119(a) to Japanese Patent Application No. 2016-172244 filed on Sep. 2, 2016 and Japanese Patent Application No. 2017-166085 filed on Aug. 30, 2017. Each of the above applications is hereby expressly incorporated by reference, in its entirety, into the present application.

BACKGROUND OF THE INVENTION

1. Field of the Invention

The present invention relates to a solution containing an organic solvent and a stabilizer. Furthermore, the present invention relates to a solution storage body storing the solution, an actinic ray-sensitive or radiation-sensitive resin composition containing the solution, and a pattern forming method and a manufacturing method of a semiconductor device using the solution.

2. Description of the Related Art

Conventionally, in a semiconductor device manufacturing process such as integrated circuit (IC) or a large scale integrated circuit (LSI), microfabrication is performed by lithography by using a photoresist composition. In recent years, as the integrated circuit has been more highly integrated, the formation of an ultrafine pattern in a submicron region and a quarter-micron region has been required. Consequently, an exposure wavelength such as a g-line tends to be replaced with a shorter wavelength such as an i-line and a KrF excimer laser light. Furthermore, currently, lithography in which electron beams, X-rays, or extreme ultraviolet (EUV) rays are used in addition to excimer laser light is under development.

In lithography, a film is formed of a photoresist composition (an actinic ray-sensitive or radiation-sensitive resin composition which is also called chemical amplification-type resist composition), the obtained film is then developed using a developer, and the film having undergone development is washed with a rinse solution. In addition, in order to improve the wettability of the photoresist composition with respect to a substrate, before the substrate is coated with the photoresist composition, a prewet solution is brought into contact with the surface of the substrate.

It is apprehended that in the aforementioned semiconductor device manufacturing process, the intermixing of coarse particles having a size of several micrometers may cause a defect failure in the semiconductor device. Therefore, raw materials, solvents, and the like used in the semiconductor device manufacturing process are required to have high purity.

Incidentally, as described in JP1989-049000A (JP-H09-049000A) in some cases, an organic solvent contains an antioxidant for the purpose of inhibiting temporal decomposition and the like. That is, for example, a polyhydric alcohol-based organic solvent has a problem in which in a case where the organic solvent is used in its pure form, a radical occurs in the molecule thereof and turns into a peroxide and then to an organic acid. Therefore, in order to prevent the problem, an antioxidant is used.

SUMMARY OF THE INVENTION

The inventors of the present invention investigated a semiconductor device manufacturing process by using an organic solvent into which a stabilizer represented by an antioxidant described in JP1989-049000A (JP-H09-049000A) was introduced (hereinafter, a liquid containing a stabilizer and an organic solvent will be referred to as "solution"). As a result, it was revealed that the stabilizer is a cause of a defect failure.

Specifically, for example, it was confirmed that in a case where the solution was used as a prewet solution and brought into contact with a substrate, sometimes the stabilizer remained on the substrate surface without being volatilized and leaded to a defect failure (particle defect). Furthermore, it was confirmed that the stabilizer remaining on the substrate surface still remained in a film even after a post-exposure baking treatment step for a resist film that was performed during pattern formation following the prewet step, and became a cause of a defect failure in the film.

In addition, for example, it was confirmed that in a case where the solution was used as a diluent of resist materials (solid components such as a resin forming a resist film, a photoacid generator, and a photopolymerization initiator) contained in a photoresist composition, the stabilizer still remained in a film even after the post-exposure baking treatment step for a resist film and caused a defect failure in the film.

Moreover, for example, it was confirmed that in a case where the solution was used as a developer, particles adhered to the substrate surface and caused a defect failure.

In contrast, as a result of reducing the content of the stabilizer with respect to the organic solvent, the inventors of the present invention found that the organic solvent readily undergoes temporal decomposition (in other words, the temporal stability of the organic solvent is poor).

Therefore, an object of the present invention is to provide a solution which is excellent in both the temporal stability of an organic solvent and the defect inhibition properties.

Another object of the present invention is to provide a solution storage body storing the solution, an actinic ray-sensitive or radiation-sensitive resin composition containing the solution, and a pattern forming method and a manufacturing method of a semiconductor device using the solution.

In order to achieve the above objects, the inventors of the present invention conducted an intensive examination. As a result, the inventors have found that in case where the content of a stabilizer with respect to the total mass of the solution is within a predetermined range of numerical values, the above objects can be achieved. Based on the finding, the inventors have accomplished the present invention.

That is, the inventors have found that the above objects can be achieved by the following constitution.

(1) A solution comprising an organic solvent and a stabilizer, in which a content of the stabilizer with respect to a total mass of the solution is 0.1 to 50 mass ppm.

(2) The solution described in (1) that is used in a semiconductor device manufacturing process.

(3) The solution described in (1) or (2), in which the organic solvent is at least one kind of solvent selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, 4-methyl-2-pentanol, chloroform, cyclophenyl methyl ether, dichloromethane, diethyl ether, diisopropyl ether, 1,4-dioxane, isoamyl acetate, and tetrahydrofuran.

(4) The solution described in any one of (1) to (3), in which a content of a metal component containing an element selected from the group consisting of Fe, Cr, Ni, and Pb with respect to the total mass of the solution is 0.001 to 1,000 mass ppt.

(5) The solution described (4), in which the content of the metal component containing an element selected from the group consisting of Fe, Cr, Ni, and Pb with respect to the total mass of the solution is 0.1 to 1,000 mass ppt.

(6) The solution described in any one of (1) to (5), in which a content of an organic impurity with respect to the total mass of the solution is 0.01 to 10,000 mass ppm.

(7) The solution described in (6), in which the content of the organic impurity with respect to the total mass of the solution is 0.1 to 10,000 mass ppm.

(8) The solution described in any one of (1) to (7), in which the stabilizer is an antioxidant.

(9) The solution described in (8), in which the antioxidant is at least one kind of compound selected from the group consisting of dibutylhydroxytoluene, hydroquinone, didodecyl 3,3'-thiodipropionate, dioctadecyl 3,3'-thiodipropionate, ditetradecyl 3,3'-thiodipropionate, 4,4'-butylidenebis-(6-t-butyl-3-methylphenol), 2,2'-methylenebis-(4-ethyl-6-t-butylphenol), butylhydroxyanisole, tris(2-ethylhexyl) phosphite, 2-hydroxy-4-methoxybenzophenone, and triisodecyl phosphite.

(10) The solution described in (8) or (9), in which a boiling point of the antioxidant is 150° C. to 500° C.

(11) The solution described in any one of (1) to (10), in which the number of objects to be counted that are counted by a light scattering-type liquid-borne particle counter and have a size equal to or greater than 0.1 μm is equal to or smaller than 100/mL.

(12) The solution described in any one of (1) to (11), in which a content of water with respect to the total mass of the solution is 0.01% to 1.0% by mass.

(13) The solution described in any one of (1) to (12), in which a content of a peroxide is 0.01 to 10 mass ppm.

(14) The solution described in any one of (1) to (13) that is used for at least one use selected from a prewet solution, a developer, a rinse solution, and a solvent contained in an actinic ray-sensitive or radiation-sensitive resin composition in a semiconductor device manufacturing process.

(15) A solution storage body comprising a container and the solution described in any one of (1) to (14) stored in the container.

(16) The solution storage body described in (15), in which a solution contact portion contacting the solution in the container is formed of a nonmetallic material or stainless steel.

(17) The solution storage body described in (16), in which a Cr/Fe ratio within a surface of the stainless steel constituting the solution contact portion satisfies 1<Cr/Fe<3 in terms of at % ratio.

(18) An actinic ray-sensitive or radiation-sensitive resin composition comprising the solution described in any one of (1) to (14).

(19) A pattern forming method comprising a prewet step of bringing a prewet solution into contact with a substrate, a resist film forming step of forming a resist film on the substrate by using an actinic ray-sensitive or radiation-sensitive resin composition, an exposure step of exposing the resist film, and a development step of developing the exposed resist film by using a developer, in which the solution described in any one of (1) to (14) is used as the prewet solution.

(20) A pattern forming method comprising a resist film forming step of forming a resist film on a substrate by using an actinic ray-sensitive or radiation-sensitive resin composition, an exposure step of exposing the resist film, and a development step of developing the exposed resist film by using a developer, in which the actinic ray-sensitive or radiation-sensitive resin composition contains the solution described in any one of (1) to (14).

(21) A pattern forming method comprising a resist film forming step of forming a resist film on a substrate by using an actinic ray-sensitive or radiation-sensitive resin composition, an exposure step of exposing the resist film, and a development step of developing the exposed resist film by using a developer, in which the solution described in any one of (1) to (14) is used as the developer.

(22) A manufacturing method of a semiconductor device comprising the pattern forming method described in any one of (19) to (21).

According to the present invention, it is possible to provide a solution which is excellent in both the temporal stability of an organic solvent and the defect inhibition properties.

Furthermore, according to the present invention, it is possible to provide a solution storage body storing the solution, an actinic ray-sensitive or radiation-sensitive resin composition containing the solution, and a pattern forming method and a manufacturing method of a semiconductor device using the solution.

DESCRIPTION OF THE PREFERRED EMBODIMENTS

Hereinafter, the present invention will be specifically described.

In the following section, constituents will be described based on typical embodiments of the present invention, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis, mixing, and the like but also the preparation of a specific substance by means of purchase.

In the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, a bright line spectrum of a mercury lamp, far ultraviolet rays represented by an excimer laser, extreme ultraviolet radiation (EUV rays), X-rays, electron beams, and the like. In addition, in the present invention, light means actinic rays or radiation. In the present invention, unless otherwise specified, "exposure" includes not only exposure by a mercury lamp, far ultraviolet rays represented by an excimer laser, X-rays, and EUV rays, but also lithography by particle beams such as electron beams or ion beams.

Solution

The solution according to the embodiment of the present invention contains an organic solvent and a stabilizer, in which a content of the stabilizer with respect to a total mass of the solution is 0.1 to 50 mass ppm.

By having the above constitution, the solution according to the embodiment of the present invention is excellent in both the temporal stability of the organic solvent and the defect inhibition properties. That is, by making the content of the stabilizer in the solution equal to or greater than 0.1 mass ppm, the temporal stability of the organic solvent constituting the main component of the solution becomes excellent. In contrast, by making the content of the stabilizer in the solution equal to or smaller than 50 mass ppm, the solution exhibit excellent defect inhibition properties in a case where the solution is used in a semiconductor device manufacturing process.

The solution can be prepared by mixing together an organic solvent and a predetermined amount of a stabilizer. Furthermore, the solution can be prepared by performing a purification step such as distillation and filtering on a commercial organic solvent containing a stabilizer.

Hereinafter, the solution according to the embodiment of the present invention will be specifically described.

<Organic Solvent>

The organic solvent is not particularly limited, and examples thereof include various organic solvents used in a semiconductor device manufacturing process and various organic solvents used in the process of manufacturing various materials used in a semiconductor device manufacturing process. Examples of the organic solvent include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methyl cyclohexanol, trimethyl cyclohexanol, 4-methyl-3-heptanol, 6-methyl-2-heptanol, 1-octanol, 2-octanol, 3-octanol, 2-propyl-1-pentanol, 2,4,4-trimethyl-1-pentanol, 2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, dihexyl ether, dioctyl ether, cyclopentyl methyl ether, cyclohexyl methyl ether, cyclododecylmethyl ether, cyclopentyl ethyl ether, cyclohexyl ethyl ether, cyclopentyl propyl ether, cyclopentyl-2-propyl ether, cyclohexylpropyl ether, cyclohexyl-2-propyl ether, cyclopentyl butyl ether, cyclopentyl-tert-butyl ether, cyclohexyl butyl ether, cyclopentyl-tert-butyl ether, bromomethyl methyl ether, iodomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, di-2-bromoethyl ethyl ether, 2,2,2-trifluoroethyl ether, chloromethyl octyl ether, bromomethyl octyl ether, di-2-chloroethyl ether, ethyl vinyl ether, butyl vinyl ether, allyl ethyl ether, allyl propyl ether, allyl butyl ether, diallyl ether, 2-methoxypropene, ethyl-1-propenylether, 1-methoxy-1,3-butadiene, cis-1-bromo-2-ethoxyethylene, 2-chloroethyl vinyl ether, allyl-1,1,2,2-tetrafluoroethyl ether, octane, isooctane, nonane, decane, methyl cyclohexane, decalin, xylene, amyl benzene, ethyl benzene, diethyl benzene, cumene, sec-butyl benzene, cymene, dipentene, γ-butyrolactone, isophorone, methyl pyruvate, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, isoamyl acetate, n-butanol, chloroform, cyclophenyl methyl ether, dichloromethane, 1,4-dioxane, tetrahydrofuran, and the like.

Among these, an organic solvent used as a prewet solution or a developer in a semiconductor device manufacturing process and an organic solvent used as a diluent of resist materials in an actinic ray-sensitive or radiation-sensitive resin composition are preferable, and at least one kind of solvent selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, 4-methyl-2-pentanol, chloroform, cyclophenyl methyl ether, dichloromethane, diethyl ether, diisopropyl ether, 1,4-dioxane, isoamyl acetate, and tetrahydrofuran is more preferable.

Two or more kinds of organic solvents may be used in combination at any ratio. The combination is not particularly limited, but it is preferable to combine two or more kinds of organic solvents having different boiling points, different solubility parameters, or different dielectric constants. In a case where the above constitution is adopted, the occurrence of a defect in a semiconductor device can be further reduced. For example, in a case where an organic solvent having a low dielectric constant is used, the occurrence of a defect in a semiconductor device by static electricity can be reduced.

In the present specification, the boiling point means a boiling point at 1 atm.

In a case where two or more kinds of organic solvents are combined, the use of ethers is preferable, and the use of two or more kinds of ethers in combination is more preferable. In a case where ethers are used, the occurrence of a defect in a semiconductor device can be further reduced.

In a case where two or more kinds of ethers are combined, it is preferable to combine compounds selected from the group consisting of propylene glycol monomethyl ether acetate, propylene glycol monomethyl ether, diethylene glycol monomethyl ether, diethylene glycol monoethyl ether, and diethylene glycol monobutyl ether.

Among these, a combination (mixed solvent) of propylene glycol monomethyl ether acetate and propylene glycol monomethyl ether is preferable. In a case where two kinds of organic solvents are used in combination, the mixing ratio (mass) thereof is preferably within a range of 1/99 to 99/1, more preferably within a range of 10/90 to 90/10, and even more preferably within a range of 20/80 to 60/40.

Furthermore, three or more kinds of organic solvents may be mixed together at any ratio. In a case where three or more kinds of organic solvents are mixed together at any ratio, for example, it is possible to perform an operation such as delicate adjustment of a resist shape and adjustment of viscosity. Examples of the combination of three or more kinds of organic solvents include a combination of propylene glycol monomethyl ether acetate (PGMEA), propylene glycol monomethyl ether (PGME), and γ-butyrolactone, a combination of PGMEA, PGME, and cyclohexanone, a combination of PGMEA, PGME, and 2-heptanone, a combination of PGMEA, cyclohexanone, and γ-butyrolactone, a combination of PGMEA, γ-butyrolactone, and 2-heptanone, and the like.

As the components (for example, an organic solvent) used at the time of manufacturing the solution and the raw materials of the components (for example, an organic solvent) used at the time of manufacturing the solution, high-purity grade products (particularly, products in which the content of metal components which will be described later, water, organic impurities which will be described later, and the like is small) can be purchased and used. Furthermore, the aforementioned high-purity grade products may be used after being subjected to a purification treatment which will be described later.

It is preferable that the solution according to the embodiment of the present invention is a solution which is substantially formed of an organic solvent. "Substantially formed of an organic solvent" means that the content of the organic solvent with respect to the total mass of the solution is equal to or greater than 98.00% by mass. The content of the organic solvent is preferably equal to or greater than 99.00% by mass, more preferably equal to or greater than 99.50% by mass, even more preferably equal to or greater than 99.80% by mass, and particularly preferably equal to or greater than 99.90% by mass. The upper limit is not particularly limited, but is about 99.99% by mass for example.

One kind of organic solvent may be used singly, or two or more kinds of such organic solvents may be used in combination. In a case where two or more kinds of organic solvents are used in combination, the total content thereof is preferably within the above range.

<Stabilizer>

The stabilizer is not particularly limited as long as it is a substance generally used as a stabilizer for an organic solvent. Examples of the stabilizer include an antioxidant, a chelating agent, and the like.

The antioxidant is not particularly limited, and examples thereof include a phenol-based antioxidant, a hindered amine-based antioxidant, a phosphorus-based antioxidant, a sulfur-based antioxidant, a benzotriazole-based antioxidant, a benzophenone-based antioxidant, a hydroxylamine-based antioxidant, a salicylic acid ester-based antioxidant, and a triazine-based antioxidant.

Examples of the phenol-based antioxidant include a hindered phenol-based antioxidant. Examples of the hindered phenol-based antioxidant include 2,4-bis[(laurylthio)methyl]-o-cresol, 1,3,5-tris(3,5-di-t-butyl-4-hydroxybenzyl), 1,3,5-tris(4-t-butyl-3-hydroxy-2,6-dimethylbenzyl), 2,4-bis-(n-octylthio)-6-(4-hydroxy-3,5-di-t-butylanilino)-1, 3,5-triazine, pentaerythritol tetrakis[(3-(3,5-di-tert-butyl-4-hydroxyphenyl)propionate], 2,6-di-t-butyl-4-nonylphenol, 2,2'-isobutylidene-bis-(4,6-dimethyl-phenol), 4,4'-butylidene-bis-(2-t-butyl-5-methylphenol), 2,2'-thio-bis-(6-t-butyl-4-methylphenol), 2,5-di-t-amyl-hydroquinone, 2,2'-thiodiethylbis-(3,5-di-t-butyl-4-hydroxyphenyl)-propionate, 1,1,3-tris-(2'-methyl-4'-hydroxy-5'-t-butylphenyl)-butane, 2,2'-methylene-bis-(6-(1-methyl-cyclohexyl)-p-cresol), 2,4-dimethyl-6-(1-methyl-cyclohexyl)-phenol, N,N-hexamethylenebis(3,5-di-t-butyl-4-hydroxy-hydrocinnamamide), 4,4'-butylidenebis-(6-t-butyl-3-methylphenol), 2,2'-methylenebis-(4-ethyl-6-t-butylphenol), butyl hydroxyanisole, and the like. In addition, oligomer type and polymer type compounds having a hindered phenol structure can also be used.

Furthermore, examples of the phenol-based antioxidant include, in addition to the aforementioned hindered phenol-based antioxidant, dibutyl hydroxytoluene and hydroquinone.

Examples of the hindered amine-based antioxidant include bis(2,2,6,6-tetramethyl-4-piperidine)sebacate, bis(N-methyl-2,2,6,6-tetramethyl-4-piperidine)sebacate, N,N'-bis(2,2,6,6-tetramethyl-4-piperidine)-1,6-hexamethylenediamine, 2-methyl-2-(2,2,6,6-tetramethyl-4-piperidyl)amino-N-(2,2,6,6-tetramethyl-4-piperidyl)propion amide, tetrakis(2,2,6,6-tetramethyl-4-piperidyl) 1,2,3,4-butanetetracarboxylate, poly[{(6-(1,1,3,3-tetramethylbutyl)imino-1,3,5-triazine-2,4-diyl}{(2,2,6,6-tetramethyl-4-piperidyl)imino}hexamethyl {(2,2,6,6-tetramethyl-4-piperidyl)imino}], poly[(6-morpholino-1,3,5-triazine-2,4-diyl) {(2,2,6,6-tetramethyl-4-piperidyl)imino}hexamethine{(2,2,6,6-tetramethyl-4-piperidyl)imino}], a polycondensate of dimethyl succinate and 1-(2-hydroxyethyl)-4-hydroxy-2,2,6,6-tetramethyl piperidine, N,N'-4,7-tetrakis[4,6-bis{N-butyl-N-(1,2,2,6,6-pentamethyl-4-piperidyl)amino}-1,3,5-triazin-2-yl]-4,7-diazadecane-1,10-diamine, and the like. In addition, oligomer type and polymer type compounds having a hindered amine structure and the like can also be used.

Examples of the phosphorus-based antioxidant include tris(isodecyl)phosphite, tris(tridecyl)phosphite, phenyl isooctyl phosphite, phenyl isodecyl phosphite, phenyl di(tridecyl)phosphite, diphenyl isooctyl phosphite, diphenyl isodecyl phosphite, diphenyl tridecyl phosphite, triphenyl phosphite, tris(nonylphenyl)phosphite, 4,4'-isopropylidenediphenol alkyl phosphite, trisnonylphenyl phosphite, trisdinonylphenyl phosphite, tris(2,4-di-t-butylphenyl)phosphite, tris(biphenyl)phosphite, distearyl pentaerythritol diphosphite, di(2,4-di-t-butylphenyl)pentaerythritol diphosphite, di(nonylphenyl)pentaerythritol diphosphite, phenyl bisphenol A pentaerythritol diphosphite, tetratridecyl 4,4'-butylidene bis(3-methyl-6-t-butylphenol)diphosphite, hexatridecyl 1,1,3-tris(2-methyl-4-hydroxy-5-t-butylphenyl)butane triphosphite, 3,5-di-t-butyl-4-hydroxybenzyl phosphite diethyl ester, sodium bis(4-t-butylphenyl)phosphite, sodium-2,2-methylene-bis(4,6-di-t-butylphenyl)-phosphite, 1,3-bis(diphenoxyphosphonyloxy)-benzene, tris(2-ethylhexyl)phosphite, triisodecyl phosphite, ethyl bis(2,4-di-tert-butyl-6-methylphenyl)phosphite, and the like. In addition oligomer type and polymer type compounds having a phosphite structure and the like can also be used.

Examples of the sulfur-based antioxidant include 2,2,-thio-diethylenebis[3-(3,5-di-t-butyl-4-hydroxyphenyl)propionate], 2,4-bis[(octylthio)methyl]-o-cresol, 2,4-bis[(laurylthio)methyl]-o-cresol, didodecyl 3,3'-thiodipropionate, dioctadecyl 3,3'-thiodipropionate, ditetradecyl 3,3'-thiodipropionate, and the like. In addition, oligomer type and polymer type compounds having a thioether structure and the like can also be used.

As the benzotriazole-based antioxidant, oligomer type and polymer type compounds having a benzotriazole structure and the like can also be used.

Examples of the benzophenone-based antioxidant include 2-hydroxy-4-methoxybenzophenone, 2,4-dihydroxybenzophenone, 2-hydroxy-4-n-octoxybenzophenone, 4-dodecyloxy-2-hydroxybenzophenone, 2-hydroxy-4-octadecyloxybenzophenone, 2,2'-dihydroxy-4-methoxybenzophenone, 2,2'-dihydroxy-4,4'-dimethoxybenzophenone, 2,2',4,4'-tetrahydroxybenzophenone, 2-hydroxy-4-methoxy-5-sulfobenzophenone, 2-hydroxy-4-methoxy-2'-carboxybenzophenone, 2-hydroxy-4-chlorobenzophenone, and the like. In addition, oligomer type and polymer type compounds having a benzophenone structure can also be used.

Examples of the triazine-based antioxidant include 2,4-bis(allyl)-6-(2-hydroxyphenyl)-1,3,5-triazine and the like. In addition, oligomer type and polymer type compounds having a triazine structure can also be used.

Examples of the salicylic acid ester-based antioxidant include phenyl salicylate, p-octylphenyl salicylate, p-tert-butyl phenyl salicylate, and the like. In addition, oligomer type and polymer type compounds having a salicylic acid ester structure can also be used.

Among the above antioxidants, a sulfur-based antioxidant, a phenol-based antioxidant, a benzophenone-based antioxidant, or a phosphorus-based antioxidant is preferable. Among these, from the viewpoint of further improving the temporal stability of the organic solvent and making it difficult for a defect failure to occur (that is, further improving the defect inhibition properties), at least one kind of antioxidant selected from the group consisting of dibutyl hydroxytoluene, hydroquinone, didodecyl 3,3'-thiodipropionate, dioctadecyl 3,3'-thiodipropionate, ditetradecyl 3,3,'-thiodipropionate, 4,4'-butylidenebis-(6-t-butyl-3-methylphenol), 2,2'-methylenebis-(4-ethyl-6-t-butylphenol), butyl hydroxyanisole, tris(2-ethylhexyl)phosphite, 2-hydroxy-4-methoxybenzophenone, and triisodecyl phosphite is even more preferable.

One kind of antioxidant can be used singly, or, if necessary, two or more kinds of antioxidants can be used by being mixed together at any ratio.

The chelating agent is not particularly limited, and examples thereof include a carboxylic acid-based chelating agent, a phosphonic acid-based chelating agent, and a sulfonic acid-based chelating agent. Among these, a carboxylic acid-based chelating agent or a phosphonic acid-based chelating agent is preferable.

The carboxylic acid-based chelating agent is not particularly limited, but is preferably citric acid, gallic acid, or polyaminopolycarboxylic acid. The polyaminopolycarboxylic acid is a compound having a plurality of amino groups and a plurality of carboxylic acid groups.

Examples of the polyaminopolycarboxylic acid include diethylenetriamine pentaacetic acid (DTPA), ethylenediamine tetrapropionic acid, triethylenetetramine hexaacetatic acid, 1,3-diamino-2-hydroxypropane-N,N,N',N'-tetraacetic acid, propylenedimaine tetraacetic acid, ethylenediamine tetraacetic acid (EDTA), and the like. Among these, diethylenetriamine pentaacetic acid (DTPA) or ethylenediamine tetraacetic acid (EDTA) is preferable.

The chelating agent having a phosphonic acid group is not particularly limited, and examples thereof include 9,10-dihydro-9-oxa-10-phoephophenanthrene-10-oxide.

One kind of chelating agent can be used singly, or, if necessary, two or more kinds of chelating agents can be used by being mixed together at any ratio.

From the viewpoint of further improving the temporal stability of the organic solvent, among the above stabilizers, an antioxidant is more preferable.

If necessary, the antioxidant and the chelating agent may be used in combination at any ratio. Particularly, in a case where the antioxidant and the chelating agent are used in combination, from the viewpoint of further improving the temporal stability of the organic solvent and from the viewpoint of further improving the defect inhibition properties, it is preferable to use a phenol-based antioxidant and a carboxylic acid-based chelating agent in combination, and it is more preferable to use dibutyl hydroxytoluene or 2,2'-methylenebis-(4-ethyl-6-t-butylphenol) as an antioxidant and diethylenetriamine pentaacetic acid (DTPA) or ethylenediamine tetraacetic acid (EDTA) as a chelating agent in combination.

As the antioxidant, an antioxidant having a boiling point of 150° C. to 500° C. is preferable. Examples of the antioxidant having a boiling point within a range of 150° C. to 500° C. include dibutyl hydroxytoluene (boiling point: 265° C.), hydroquinone (boiling point: 287° C.), ditetradecyl 3,3'-thiodipropionate (boiling point: 347.7° C.), 2,2'-methylenebis-(4-ethyl-6-t-butylphenol) (boiling point: 187.5° C.), and the like.

In a case where an antioxidant having a boiling point of 150° C. to 500° C. is used, in a post-exposure baking treatment step for a resist film (baking treatment step is generally performed at 70° C. to 200° C.), the antioxidant is more easily volatilized. As a result, for example, in a case where the solution according to the embodiment of the present invention is used, as a diluent of resist materials, in an actinic ray-sensitive or radiation-sensitive resin composition, it is possible to further inhibit a defect failure in the obtained resist film. Furthermore, in a case where the solution according to the embodiment of the present invention is used as a prewet solution, it is possible to further inhibit a defect failure in a resist film formed on a clarified substrate. In addition, in a case where the solution according to the embodiment of the present invention is used as a developer, it is possible to further inhibit a defect failure on the substrate surface.

From the viewpoint of further improving the above effects, the boiling point of the antioxidant is more preferably 150° C. to 400° C.

The content of the stabilizer with respect to the total mass of the solution is 0.1 to 50 mass ppm. From the viewpoint of further improving the defect inhibition properties, the content of the stabilizer with respect to the total mass of the solution is preferably 0.1 to 30 mass ppm, and more preferably 0.1 to 15 mass ppm.

One kind of stabilizer may be used singly, or two or more kinds of stabilizers may be used in combination. From the viewpoint of further improving the defect inhibition properties, it is preferable to use one kind of stabilizer singly. In a case where two or more kinds of stabilizers are used in combination, the total content thereof is preferably within the above range.

The content of the stabilizer in the solution is measured by gas chromatography (GC-MS).

As the method for making the content of the stabilizer in the solution fall into the above range, for example, a method exemplified in a purification step, which will be described later, can be used.

<Metal Component (Metal Impurity) Containing Element Selected from the Group Consisting of Fe, Cr, Ni, and Pb>

In the present invention, it has been revealed that a specific metal element contained in the solution exerts a particularly big influence on the defect performance. Therefore, the content of a metal component, which contains an element selected from the group consisting of Fe, Cr, Ni, and Pb, in the solution with respect to the total mass of the solution is preferably 0.001 to 1,000 mass ppt, and more preferably 0.1 to 1,000 mass ppt.

The metal component is present in the raw material component composing the solution, that is, in the antioxidant or the organic solvent to a certain extent, and intermixed with the solution in some cases through the antioxidant or the organic solvent.

In a case where the content of the metal component containing an element selected from the group consisting of Fe, Cr, Ni, and Pb with respect to the total mass of the solution is equal to or smaller than 1,000 mass ppt, the defect inhibition properties are further improved. Presumably, the smaller the content of the metal component containing an element selected from the group consisting of Fe, Cr, Ni, and Pb, the further occurrence of a defect can be reduced. However, the inventors of the present invention confirmed that in a case where the content of the metal component with respect to the total mass of the solution is equal to or greater than 0.001 mass ppt (preferably equal to or greater than 0.1 mass ppt), the defect inhibition properties are further improved.

The reason is unclear. However, presumably, specific metal ions described above in the solution may be more easily removed from a substrate in a case where they are in an aggregated state. For example, in a case where the solution is used as a developer, it is apprehended that metal ions derived from the developer will adhere to the substrate surface and lead to a defect failure. In contrast, in a case where the content of the specific metal component described above with respect to the total mass of the solution is equal to or greater than 0.1 mass ppt, the metal ions are easily aggregated, and accordingly, the metal ions can be efficiently removed from the substrate. Meanwhile, in a case where the content of the metal component with respect to the total mass of the solution is less than 0.001 mass ppt (particularly, less than 0.1 mass ppt), the metal ions are easily individually liberated in the solution and tend to easily remain on the substrate surface. The same trend is also observed in a case where the solution is used as a prewet solution.

In a case where the solution contains a plurality of kinds of metal components containing an element selected from the group consisting of Fe, Cr, Ni, and Pb, the total amount thereof is preferably within the above range.

From the viewpoint of further improving the defect inhibition properties and from the viewpoint of further improving the temporal stability of the organic solvent in the solution, the content of the metal component containing an element selected from the group consisting of Fe, Cr, Ni, and Pb is preferably 0.1 to 500 mass ppt, more preferably 0.1 to 100 mass ppt, and even more preferably 0.1 to 12 mass ppt.

The content of the metal impurity in the solution is measured by inductively coupled plasma mass spectrometry (ICP-MS).

As the method for making the content of the metal impurity in the solution fall into the above range, for example, a method exemplified in a purification step, which will be described later, can be used (for example, a treatment using an ion exchange resin, filtering using a metal adsorption member, or the like).

Contrary to the aforementioned method, SP-ICP-MS makes it possible to measure the content of metal particles. Accordingly, by subtracting the content of metal particles from the content of metal atoms in a sample, the content of metal ions in the sample can be calculated.

Examples of the measurement device for SP-ICP-MS include Agilent 8800 triple quadrupole inductively coupled plasma mass spectrometry (ICP-MS, for semiconductor analysis, option #200) manufactured by Agilent Technologies, Inc, NexION 350S manufactured by PerkinElmer Inc., and Agilent 8900 manufactured by Agilent Technologies, Inc.

It is desired that the content of an organic impurity in the solution is reduced. Particularly, the content of the organic impurity with respect to the total mass of the solution is more preferably adjusted to become 0.01 to 10,000 mass ppm (preferably 0.1 to 10,000 mass ppm, and more preferably 1 to 10,000 mass ppm).

The organic impurity is derived from the organic solvent or the stabilizer composing the solution, and means a raw material component used at the time of synthesizing the organic solvent or the stabilizer and a structural isomer or a multimer of the organic solvent or the stabilizer. Accordingly, the organic impurity is intermixed with the solution through the organic solvent or the stabilizer in some cases. The organic impurity mentioned herein does not contain the stabilizer, a peroxide which will be described later, and water. That is, the organic impurity is preferably an organic component other than the organic solvent, the stabilizer, the peroxide, and water.

In a case where the organic solvent is butyl acetate, the solution contains n-butanol in a relatively large amount as an organic impurity derived from the butyl acetate. In a case where the organic solvent is PGMEA, the solution contains propylene glycol as an organic impurity derived from PGMEA. In a case where the organic solvent is cyclohexanone, the solution can contain cyclohexanol in a relatively large amount as an organic impurity derived from the cyclohexanone.

In a case where the organic solvent is, for example, an alcohol compound, a ketone compound, an ester compound, an ether compound, and an aldehyde compound, examples of the organic impurity derived from the organic solvent composing the solution include an alcohol compound, a ketone compound, an ester compound, an ether compound, and an aldehyde compound which are unreacted substances or by-products in the purification of the organic solvent. Examples thereof include compounds represented by Formulae I to V. Among these, the compounds represented by Formulae I to V, particularly those having 6 or more carbon atoms have a high boiling point. Therefore, these compounds easily remain on a semiconductor processing substrate and readily become a cause of a defect.

Hereinafter, Formulae I to V will be described.

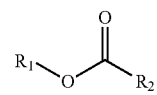

I

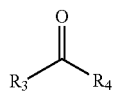

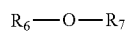

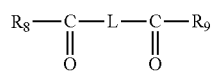

In Formula I, $R_1$ and $R_2$ each independently represent an alkyl group or a cycloalkyl group or form a ring by being bonded to each other.

As the alkyl group and the cycloalkyl group represented by $R_1$ and $R_2$, an alkyl group having 1 to 12 carbon atoms or a cycloalkyl group having 6 to 12 carbon atoms are preferable, and an alkyl group having 1 to 8 carbon atoms or a cycloalkyl group having 6 to 8 carbon atoms are more preferable.

The ring formed by the bonding of $R_1$ and $R_2$ is a lactone ring which is more preferably a 4- to 9-membered lactone ring and even more preferably a 4- to 6-membered lactone ring.

It is preferable that $R_1$ and $R_2$ satisfy a relationship in which the number of carbon atoms in the compound represented by Formula I becomes equal to or greater than 6.

In Formula II, $R_3$ and $R_4$ each independently represent a hydrogen atom, an alkyl group, an alkenyl group, a cycloalkyl group, or a cycloalkenyl group or form a ring by being bonded to each other. Here, $R_3$ and $R_4$ do not simultaneously represent a hydrogen atom.

As the alkyl group represented by $R_3$ and $R_4$, for example, an alkyl group having 1 to 12 carbon atoms is preferable, and an alkyl group having 1 to 8 carbon atoms is more preferable.

As the alkenyl group represented by $R_3$ and $R_4$, for example, an alkenyl group having 2 to 12 carbon atoms is preferable, and an alkenyl group having 2 to 8 carbon atoms is more preferable.

As the cycloalkyl group represented by $R_3$ and $R_4$, a cycloalkyl group having 6 to 12 carbon atoms is preferable, and a cycloalkyl group having 6 to 8 carbon atoms is more preferable.

As the cycloalkenyl group represented by $R_3$ and $R_4$, for example, a cycloalkenyl group having 3 to 12 carbon atoms is preferable, and a cycloalkenyl group having 6 to 8 carbon atoms is more preferable.

The ring formed by the bonding of $R_3$ and $R_4$ is a cyclic ketone structure which may be a saturated cyclic ketone or an unsaturated cyclic ketone. The cyclic ketone is preferably 6- to 10-membered ring, and more preferably 6- to 8-membered ring.

It is preferable that $R_3$ and $R_4$ satisfy a relationship in which the number of carbon atoms in the compound represented by Formula II becomes equal to or greater than 6.

In Formula III, $R_5$ represents an alkyl group or a cycloalkyl group.

The alkyl group represented by $R_5$ is an alkyl group having 6 or more carbon atoms. The alkyl group is preferably an alkyl group having 6 to 12 carbon atoms, and more preferably an alkyl group having 6 to 10 carbon atoms.

The alkyl group may have an ether bond in a chain or have a substituent such as a hydroxy group.

The cycloalkyl group represented by $R_5$ is a cycloalkyl group having 6 or more carbon atoms. The cycloalkyl group is preferably a cycloalkyl group having 6 to 12 carbon atoms, and more preferably cycloalkyl group having 6 to 10 carbon atoms.

In Formula IV, $R_6$ and $R_7$ each independently represent an alkyl group or a cycloalkyl group or form a ring by being bonded to each other.

As the alkyl group represented by $R_6$ and $R_7$, for example, an alkyl group having 1 to 12 carbon atoms is preferable, and an alkyl group having 1 to 8 carbon atoms is more preferable.

As the cycloalkyl group represented by $R_6$ and $R_7$, a cycloalkyl group having 6 to 12 carbon atoms is preferable, and a cycloalkyl group having 6 to 8 carbon atoms is more preferable.

The ring formed by the bonding of $R_6$ and $R_7$ is a cyclic ether structure. The cyclic ether structure is preferably a 4- to 8-membered ring, and more preferably a 5- to 7-membered ring.

It is preferable that $R_6$ and $R_7$ satisfy a relationship in which the number of carbon atoms in the compound represented by Formula IV becomes equal to or greater than 6.

In Formula V, $R_8$ and $R_9$ each independently represent an alkyl group or a cycloalkyl group or form a ring by being bonded to each other. L represents a single bond or an alkylene group.

As the alkyl group represented by $R_8$ and $R_9$, for example, an alkyl group having 6 to 12 carbon atoms is preferable, and an alkyl group having 6 to 10 carbon atoms is more preferable.

As the cycloalkyl group represented by $R_8$ and $R_9$, a cycloalkyl group having 6 to 12 carbon atoms is preferable, and a cycloalkyl group having 6 to 10 carbon atoms is more preferable.

The ring formed by the bonding of $R_8$ and $R_9$ is a cyclic diketone structure. The cyclic diketone structure is preferably a 6- to 12-membered ring, and more preferably 6- to 10-membered ring.

As the alkylene group represented by L, for example, an alkylene group having 1 to 12 carbon atoms is preferable, and an alkylene group having 1 to 10 carbon atoms is more preferable.

It is preferable that $R_8$, $R_9$, and L satisfy a relationship in which the number of carbon atoms in the compound represented by Formula V becomes equal to or greater than 6.

In a case where the organic solvent is an amide compound, an imide compound, or a sulfoxide compound, examples of the organic impurity derived from the organic solvent include, but are not particularly limited to, an alcohol compound, a ketone compound, an ester compound, an ether compound, and an aldehyde compound which are unreacted substances or by-products in the purification of the organic solvent. Among these, particularly those having 6 or more carbon atoms have a high boiling point. Therefore, these compounds easily remain on a semiconductor processing substrate and readily become a cause of a defect. Examples of such organic impurities include the following compounds.

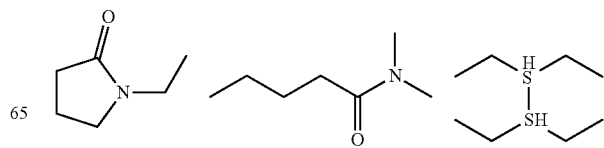

-continued

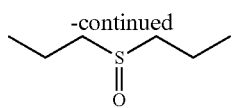

In addition, as the organic impurity, a resin component, a plasticizer (for example, dioctyl phthalate, diisononyl phthalate, dibutyl phthalate, or the like), and the like contained in a plastic material (for example, an O-ring or the like) used in a member of a manufacturing device can be considered. Examples thereof include impurities eluted into the solution at any point in time during the manufacturing process.

In a case where the content of the organic impurity with respect to the total mass of the solution is equal to or smaller than 10,000 mass ppm, the defect inhibition properties are further improved, and the temporal stability of the organic solvent in the solution is further improved. Presumably, the smaller the content of the organic impurity, the further the occurrence of a defect can be reduced. However, the inventors of the present invention confirmed that particularly in a case where the content of the organic impurity with respect to the total mass of the solution is equal to or greater than 0.1 mass ppm (preferably equal to or greater than 1 mass ppm), the defect inhibition properties are further improved.

The reason is unclear but is assumed to be as below.

It is considered that a case where the organic impurity functions as a chelating agent for metal ions in the solution, and the metal ions have been chelated, it is easy to efficiently remove the metal ions from a substrate. For example, in a case where the solution is used as a developer, it is apprehended that the metal ions derived from the developer will adhere to the substrate surface and cause a defect failure. In contrast, in a case where the content of the organic impurity with respect to the total mass of the solution is equal to or greater than 0.1 mass ppm, many of metal ions are chelated, and accordingly, the metal ions can be efficiently removed from a substrate. Meanwhile, in a case where the content of the organic impurity with respect to the total mass of the solution is less than 0.1 mass ppm, the metal ions are easily individually liberated in the solution and tend to easily remain on the substrate surface. The same trend is also observed in a case where the solution is used as a prewet solution.

From the viewpoint of further improving the defect inhibition properties and further improving the temporal stability of the organic solvent in the solution, the content of the organic impurity is more preferably 0.1 to 5,000 mass ppm, and even more preferably 1 to 5,000 mass ppm.

The content of the organic impurity in the solution is measured by gas chromatography (GC-MS).

As the method for making the content of the organic impurity in the solution fall into the above range, for example, a method exemplified in a purification step, which will be described later, can be used.

<Peroxide>

The solution contains a peroxide in some cases. The content of the peroxide in the solution with respect to the total mass of the solution is preferably 0.01 to 10 mass ppm.

The peroxide means a compound having a peroxide structure (—O—O—) or a carboxylic acid structure (—C(=O)—O—O—). The peroxide is generated, for example, in a manner in which an ether structure or a carboxylic acid structure in an organic solvent such as propylene glycol monomethyl ether acetate (PGMEA) turns into a peroxide structure or a percarboxylic acid structure due to a radical generated in a molecule.

In a case where the solution contains a peroxide, and the content of the peroxide with respect to the total mass of the solution is equal to or smaller than 10 mass ppm, the temporal stability is further improved. In contrast, in a case where the content of the peroxide with respect to the total mass of the solution is equal to or greater than 0.01 mass ppm, the defect inhibition properties are further improved.

It is unclear why the defect inhibition properties are further improved in a case where the content of the peroxide with respect to the total mass of the solution is equal to or greater than 0.01 mass ppm, but the reason is assumed to be as below.

It is considered that a case where the peroxide functions as a chelating agent for metal ions in the solution, and the metal ions have been chelated, it is easy to efficiently remove the metal ions from a substrate. For example, in a case where the solution is used as a developer, it is apprehended that the metal ions derived from the developer will adhere to the substrate surface and cause a defect failure. In contrast, in a case where the content of the peroxide with respect to the total mass of the solution is 0.01 mass ppm, many of metal ions are chelated, and accordingly, the metal ions can be efficiently removed from a substrate. Meanwhile, in a case where the content of the peroxide with respect to the total mass of the solution is less than 0.01 mass ppm, the metal ions are easily individually liberated in the solution and tend to easily remain on the substrate surface. The same trend is also observed in a case where the solution is used as a prewet solution.

From the viewpoint of further inhibiting the occurrence of a defect failure resulting from the precipitation of metal ions on a substrate, the content of the peroxide is more preferably 0.01 to 5 mass ppm.

The content of the peroxide in the solution is measured by gas chromatography (GC-MS).

As the method for making the content of the peroxide in the solution fall into the above range, for example, a method exemplified in a purification step, which will be described later, can be used.

<Coarse Particles>

It is preferable that the solution substantially does not contain coarse particles.

The coarse particles mean objects to be counted having a size equal to or greater than 0.1 μm that are counted by a light scattering-type liquid-borne particle counter.

"Substantially does not contain coarse particles" means that in a case where the solution is measured using a commercial measurement device (for example, "KS-18F" (manufactured by RION Co., Ltd.)) for a light scattering-type liquid-borne particle measurement method, the number of the objects to be counted in 1 mL of the solution is equal to or smaller than 100. In a case where the number of the objects to be counted in 1 mL of the solution is equal to or smaller than 100, the defect inhibition properties are further improved, and the temporal stability of the organic solvent in the solution is further improved.

The coarse particles contained in the solution are particles of dirt, dust, organic solids, inorganic solids, and the like contained in raw materials as impurities, particles of dirt, dust, organic solids, inorganic solids, and the like incorporated as contaminants into the solution in the process of preparing the solution, or the like. The coarse particles correspond to the objects that are present as particles finally in the obtained solution without being dissolved.

The objects to be counted of the present invention are not particularly limited, as long as they are detected as objects having a size equal to or greater than 0.1 µm by a light scattering-type liquid-borne particle counter.

As the method for removing the coarse particles, for example, a treatment such as filtering which will be described later can be used.

<Water>

The solution may also contain water. The content of water in the solution with respect to the total mass of the solution is preferably 0.01% to 1.0% by mass.

The water may be moisture that the organic solvent or the antioxidant composing the solution inevitably contains or moisture inevitably incorporated into the solution at the time of manufacturing the solution. Furthermore, the water may be intentionally added water.

In a case where the content of water with respect to the total mass of the solution is equal to or smaller than 1.0% by mass, it is possible to inhibit the formation of a watermark on a substrate. In contrast, in a case where the content of water with respect to the total mass of the solution is equal to or greater than 0.01% by mass, the defect inhibition properties are further improved.

The reason why the defect inhibition properties are further improved in a case where the content of water with respect to the total mass of the solution is equal to or greater than 0.01% by mass is unclear. However, presumably, this is because the small content of water in the solution facilitates the dissolution of metal ions. For example, in a case where the solution is used as a developer, it is apprehended that the metal ions derived from the developer will adhere to the substrate surface and cause a defect failure. In contrast, in a case where the content of water with respect to the total mass of the solution is equal to or greater than 0.01% by mass, metal ions do not easily remain on the substrate surface. The same trend is also observed in a case where the solution is used as a prewet solution.

In addition, it is preferable that the content of water with respect to the total mass of the solution is equal to or smaller than 1.0% by mass because then it is possible to inhibit the occurrence of a defect by a resist residue resulting from the deterioration of developability in a case where the solution is used as a negative resist developer. Furthermore, in a case where the solution is used as a prewet solution, the occurrence of a defect resulting from solvent shock (precipitation of a resin, a photoacid generator, or the like) is inhibited.

From the viewpoint of further inhibiting watermarks and from the viewpoint of further improving the defect inhibition properties, the content of water is more preferably 0.01% to 0.5% by mass.

The content of water in the solution is measured by the method explained in Examples, which will be described later, by using a device adopting a Karl Fischer water content measurement method (coulometric titration method) as a measurement principle.

For example, as one of the methods for making the content of water in the solution fall into the above range, a method can be used in which the solution is put into a desiccator having undergone nitrogen gas purging and heated in the desiccator in a state where the internal pressure of the desiccator is being kept positive. Furthermore, by the method exemplified in a purification step which will be described later, the content of water in the solution can be adjusted to fall into the desired range.

<Method for Confirming Defect Resulting from Chemical Solution>

In a semiconductor manufacturing process, it is preferable that a defect resulting from impurities in a chemical solution (corresponding to the solution according to the embodiment of the present invention) hardly occurs.

The method for confirming a defect resulting from impurities in a chemical solution is not particularly limited and will be described based on the following example.

The method for detecting a foreign substance on a wafer or a pattern defect is not particularly limited, and a wafer surface inspection device (SP-5; manufactured by KLA-Tencor Corporation.) can be used.

A semiconductor wafer is coated with a chemical solution, and the wafer surface coated with the chemical solution is irradiated with laser beams. At this time, in a case where the laser beams touch a foreign substance/defect, light is scattered, and the scattered light is detected by a detector. The foreign substance/defect is detected in this way.

In a case where the wafer is measured by being rotated at the time of laser beam irradiation, from the rotation angle of the wafer and the radial position of the laser beams, a coordinate position of the foreign substance/defect can be assigned.

Examples of the wafer surface inspection device include a SURFSCAN series manufactured by KLA-Tencor Corporation., and the like.

Particularly, for evaluating a defect relating to the manufacturing of a fine semiconductor device at a node equal to or smaller than 10 nm, it is preferable to use a wafer surface inspection device having resolution equal to or higher than that of SP-5.

<Use>

The use of the solution according to the embodiment of the present invention is not particularly limited, but it is particularly preferable to use the solution in a semiconductor device manufacturing process. Particularly, the solution can be suitably used in a semiconductor manufacturing process at a node equal to or smaller than 10 nm. The solution according to the embodiment of the present invention can also be used in any of steps for manufacturing a semiconductor device. Specifically, examples of the use of the solution include a prewet solution with which a substrate is coated before a step of forming a resist film by using a photoresist composition so as to ameliorate the coating properties of the composition, a developer for developing an exposed resist film formed of a photoresist composition, and a rinse solution for washing a developed film. Furthermore, the solution according to the embodiment of the present invention can be used as a diluent of resist materials contained in a photoresist composition.

(Substrate)

"Substrate" mentioned in the present invention includes, for example, a semiconductor substrate including a single layer and a semiconductor substrate including multiple layers.

The material constituting the semiconductor substrate including a single layer is not particularly limited. Generally, the semiconductor substrate including a single layer is preferably constituted with silicon, silicon germanium, a group III-V compound such as GaAs, or a combination of any of these materials.

The constitution of the semiconductor substrate including multiple layers is not particularly limited. For example, the semiconductor substrate including multiple layers may have the structure of an integrated circuit in which interconnect features such as metal wires and dielectric materials are exposed on a semiconductor substrate such as silicon described above. Examples of metals and alloys used in the interconnect features include, but are not limited to, aluminum, aluminum alloyed with copper, copper, titanium, tantalum, cobalt, silicon, titanium nitride, tantalum nitride, and tungsten. Furthermore, on the semiconductor substrate, there may be an interlayer dielectric and layers of silicon oxide, silicon nitride, silicon carbide, carbon-doped silicon oxide, and the like.

The solution according to the embodiment of the present invention can also be suitably used for other uses in addition to the manufacturing of a semiconductor. The solution according to the embodiment of the present invention can be used as a developer or rinse solution for polyimide, a resist for a sensor, a resist for a lens, and the like.

Furthermore, the solution according to the embodiment of the present invention can be used as a solvent for medical uses or washing. Particularly, the solution according to the embodiment of the present invention can be suitably used for washing a container, a pipe, or a substrate (for example, a wafer, glass, or the like).

<Manufacturing Method of Solution>

It is preferable that the solution according to the embodiment of the present invention is subjected to the following purification step such that the content of the stabilizer, the metal component, the organic impurity, the peroxide, and water falls into the desired range.

(Purification Step)

The purification step is a step of purifying the solution such that the content of the components (for example, the stabilizer in an amount equal to or greater than a predetermined amount, the metal component, the organic impurity, peroxide, water, and the like) intermixed at the time of manufacturing various components such as the organic solvent and the stabilizer that compose the solution and at the time of mixing the organic solvent and the stabilizer becomes the desired content described above.

The purification step may be performed at any timing. Examples of the purification step include the following purification treatments I to IV.

That is, the purification treatment I is a treatment in which raw materials (for example, raw materials used for manufacturing the organic solvent) are purified before the manufacturing of the organic solvent and the stabilizer that compose the solution.

The purification treatment II is a treatment in which the organic solvent and the stabilizer that compose the solution a purified at the time of manufacturing the organic solvent and the stabilizer and/or after the manufacturing of the organic solvent and the stabilizer.

The purification treatment III is a treatment in which at the time of manufacturing the solution, each of the components is purified before two or more kinds of components (for example, two or more kinds of organic solvents or an organic solvent, a stabilizer, and the like) are mixed together.

The purification treatment IV is a treatment in which at the time of manufacturing the solution, after two or more kinds of components (for example, two or more kinds of organic solvents or an organic solvent, a stabilizer, and the like) are mixed together, the mixture is purified.

In a case where a commercial solution containing an organic solvent and a stabilizer is used, the purification treatment II may be performed such that the content of the stabilizer becomes the desired amount.

Each of the purification treatments I to IV may be performed once or twice or more.

Hereinafter, an example of the purification step will be described. In the following description, a subject to be purified in the purification step (for example, the organic solvent or the stabilizer, or a mixture obtained by mixing the organic solvent with the stabilizer) will be simply collectively referred to as "solution to be purified".

One of the examples of the purification step include an aspect in which a first ion exchange treatment of performing an ion exchange treatment on the solution to be purified, a dehydration treatment of dehydrating the solution to be purified having undergone the first ion exchange treatment, a distillation treatment of performing distillation of the solution to be purified having undergone the dehydration treatment, and a second ion exchange treatment of performing an ion exchange treatment on the solution to be purified having undergone the distillation treatment are carried out in this order. Hereinafter, an example of the purification step described above will be explained, but the purification method at the time of preparing the solution according to the embodiment of the present invention is not limited thereto. For example, an aspect may also be adopted in which a dehydration treatment of dehydrating the solution to be purified is carried out first and then a distillation treatment of performing distillation of the solution to be purified having undergone the dehydration treatment, a first ion exchange treatment of performing an ion exchange treatment on the solution to be purified, and an organic impurity removing treatment of removing an organic impurity from the solution to be purified having undergone a second ion exchange treatment are carried out in this order.

According to the first ion exchange treatment, an ion component (for example, a metal component or the like) in the solution to be purified can be removed.

In the first ion exchange treatment, first ion exchange means such as an ion exchange resin is used. The ion exchange resin may be any of a cation exchange resin or an anion exchange resin provided as a single bed, a cation exchange resin and an anion exchange resin provided as a dual bed, and a cation exchange resin and an anion exchange resin provided as a mixed bed.

Furthermore, in order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG•DRY (trade name, dry cation exchange resin, moisture: equal to or smaller than 2%) and MSPS2-1•DRY (trade name, mixed bed resin, moisture: equal to or smaller than 10%) manufactured by ORGANO CORPORATION, and the like.

According to the dehydration treatment, water in the solution to be purified can be removed. In a case where zeolite (particularly, MOLECULAR SIEVE (trade name) manufactured by Union Showa K. K.), which will be described later, is used in the dehydration treatment, olefins can also be removed.

Examples of dehydration means used in the dehydration treatment include a dehydration membrane, a water adsorbent insoluble in the solution to be purified, an aeration purging device using dried inert gas, a heating device, a vacuum heating device, and the like.

In a case where the dehydration membrane is used, membrane dehydration by pervaporation (PV) or vapor permeation (VP) is performed. The dehydration membrane is constituted as a permeable membrane module, for example. As the dehydration membrane, it is possible to use a membrane formed of a polymeric material such as a polyimide-based material, a cellulose-based material, and a polyvinyl alcohol-based material or an inorganic material such as zeolite.

The water adsorbent is used by being added to the solution to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

According to the distillation treatment, it is possible to remove impurities eluted from the dehydration membrane, metal components in the solution to be purified that are not easily removed by the first ion exchange treatment, fine particles (including fine particles of the metal components as well in a case where the metal components are fine particles), and water in the solution to be purified. Furthermore, it is possible to reduce the amount of the stabilizer or remove the stabilizer.

The distillation means is constituted with a single-stage distillation device, for example. By the distillation treatment, impurities are concentrated in the distillation device and the like. In order to prevent the leakage of some of the concentrated impurities, the distillation means is preferably provided with means for regularly or constantly discharging a portion of the liquid containing the concentrated impurities to the outside.

According to the second ion exchange treatment, it is possible to remove the impurities accumulated in the distillation device in a case where the impurities leak or to remove substances eluted from a pipe made of stainless steel (SUS) or the like used as a feed line.

Examples of the second ion exchange means include a tower-like container filled with an ion exchange resin and an ion adsorption membrane. Among these, an ion adsorption membrane is preferable because this makes it possible to perform the treatment at a high flow rate. Examples of the ion adsorption membrane include NEOSEPTA (trade name, manufactured by ASTOM Corporation).

Each of the treatments described above is preferably performed under a sealed condition in an inert gas atmosphere in which water is less likely to be intermixed with the solution to be purified.

Furthermore, in order to inhibit the intermixing of moisture as much as possible, each of the treatments is preferably performed in an inert gas atmosphere in which a dew-point temperature is equal to or lower than −70° C. This is because in the inert gas atmosphere at a temperature equal to or lower than −70° C., the concentration of moisture in a gas phase is equal to or lower than 2 mass ppm, and hence the likelihood that moisture will be intermixed with the solution (solution to be purified) is reduced.

Examples of the purification step include, in addition to the above treatment, the adsorptive purification treatment for metal component using silicon carbide described in WO2012/043496A, and the like.

According to the organic impurity removing treatment, it is possible to remove a high-boiling point organic impurity which is contained in the solution to be purified having undergone the distillation treatment and is not easily removed by the distillation treatment.

The organic impurity can be removed by means of an organic impurity adsorption member comprising an organic impurity adsorption filter which can adsorb the organic impurity. Generally, the organic impurity adsorption member is constituted with the aforementioned organic impurity adsorption filter and a base material to which the impurity adsorption filter is fixed.

From the viewpoint of improving the he organic impurity adsorption performance, it is preferable that the organic impurity adsorption filter has the skeleton of an organic substance, which can interact with the organic impurity, on the surface thereof (in other words, it is preferable that the surface of the organic impurity adsorption filter is modified with the skeleton of an organic substance which can interact with the organic impurity). One of the examples of the constitution in which the organic impurity adsorption filter having the skeleton of an organic substance, which can interact with the organic impurity, on the surface thereof, include an aspect in which the surface of the base material constituting the organic impurity adsorption filter, which will be described later, is provided with the skeleton of an organic substance which can interact with the organic impurity.

Examples of the skeleton of an organic substance which can interact with the organic impurity include a chemical structure which can react with the organic impurity so as to make the organic impurity trapped in the organic impurity adsorption filter. More specifically, in a case where the organic impurity includes dioctyl phthalate, diisononyl phthalate, dibutyl phthalate, and the like, examples of the skeleton of an organic substance include a benzene ring skeleton. Furthermore, in a case where the organic impurity includes long chain n-alkyl alcohol (structural isomer in a case where long chain 1-alkyl alcohol is used as a solvent) and the like, examples of the skeleton of an organic substance include an alkyl group.

Examples of the base material (material) constituting the organic impurity adsorption filter include cellulose supporting active carbon, diatomite, nylon, polyethylene, polypropylene, polystyrene, a fluororesin, and the like.

Furthermore, as an organic impurity removing filter, it is possible to use the filters obtained by fixing activated carbon to non-woven cloth that are described in JP2002-273123A and JP2013-150979A.

The organic impurity removing treatment is not limited to the aspect in which an organic impurity adsorption filter which can adsorb organic impurities as described above is used, and may adopt, for example, an aspect in which organic impurities are physically trapped. In many cases, the organic impurity having a relatively high boiling point is coarse. Therefore, in a case where a filter having a pore size of about 1 nm is used, the organic impurity can be physically trapped.

For example, in a case where the solution contains dioctyl phthalate as an organic impurity, the structure of the dioctyl phthalate is larger than 10 Å (=1 nm). Accordingly, in a case where an organic impurity removing filter having a pore size of 1 nm is used, the dioctyl phthalate cannot pass through the pore of the filter. That is, by being physically trapped by the filter, the dioctyl phthalate is removed from the solution to be purified. In this way, for removing an organic impurity, not only a chemical interaction but also a physical removing method can be used. Here, in this case, a filter having a pore size equal to or greater than 3 nm is used as "filtering member" which will be described later, and a filter having a pore size less than 3 nm is used as "organic impurity removing filter".

In the present specification, 1 Å (angstrom) equals 0.1 nm.

The purification step of the present invention may further have, for example, a purification treatment V and a purification treatment VI which will be described later. The purification treatment V and the purification treatment VI may be performed at any timing. For example, the purification treatment V and the purification treatment VI may be performed after the purification treatment IV is performed.

The purification treatment V is a filtering treatment in which a metal ion adsorption member is used for the purpose of removing metal ions.

The purification treatment VI is a filtering treatment for removing coarse particles.

Hereinafter, the purification treatment V and the purification treatment VI will be described.

One of the examples of means for removing metal ions in the purification treatment V includes filtering in which a metal ion adsorption member comprising a metal ion adsorption filter is used.

The metal ion adsorption member is constituted with at least one metal ion adsorption filter, and may be constituted with a plurality of metal ion adsorption filters which are stacked according to the intended purification level. Generally, the metal ion adsorption member is constituted with the metal ion adsorption filter and a base material to which the metal ion adsorption filter is fixed.

The metal ion adsorption filter comprises a function of adsorbing metal ions in the solution to be purified. The metal ion adsorption filter is preferably a filter which can perform ion exchange.

Herein, the metal ions to be adsorbed are not particularly limited but are preferably Fe, Cr, Ni, and Pb because these readily become the cause of a defect in a semiconductor device.

From the viewpoint of improving the metal ion adsorption performance, it is preferable that the metal ion adsorption filter has an acid group on the surface thereof. Examples of the acid group include a sulfo group, a carboxy group, and the like.

Examples of the base material (material) constituting the metal ion adsorption filter include cellulose, diatomite, nylon, polyethylene, polypropylene, polystyrene, a fluororesin, and the like.

One of other examples of means for removing metal ions includes filtering in which a filter constituted with material including polyimide and/or polyamide imide is used. Examples thereof include filtering in which a metal ion adsorption member comprising a polyimide and/or polyamide imide porous membrane described in JP2016-155121A as a metal ion adsorption filter is used. The polyimide and/or polyamide imide porous membrane used in the filtering may have at least one group selected from the group consisting of a carboxy group, a salt-type carboxy group, and a —NH— bond.

From the viewpoint of solvent resistance, it is preferable to use fluorinated polyimide and/or fluorinated polyamide imide.

One of the examples of filtering means in the purification treatment VI includes an aspect in which filtering is performed using a filtering member comprising a filter for removing particles having a diameter equal to or smaller than 20 nm. In a case where the aforementioned filter is additionally used for the solution to be purified, impurities in the form of particles can be removed from the solution to be purified. Examples of "impurities in the form of particles" include particles of dirt, dust, organic solids, inorganic solids, and the like contained in raw materials as impurities at the time of manufacturing the solution to be purified, particles of dirt, dust, organic solids, inorganic solids, and the like incorporated as contaminants into the solution to be purified at the time of purifying the solution to be purified, and the like. The impurities in the form of particles correspond to the objects that are finally present as particles in the solution to be purified without being dissolved.

Furthermore, "impurities in the form of particles" also include colloidized impurities containing metal atoms. The metal atoms are not particularly limited. However, in a case where the content of at least one kind of metal atom selected from the group consisting of Na, K, Ca, Fe, Cu, Mg, Mn, Li, Al, Cr, Ni, Zn, and Pb (preferably Fe, Cr, Ni, and Pb) is particularly small (for example, in a case where the content of each of the aforementioned metal atoms in the solution to be purified is equal to or smaller than 1,000 mass ppt), the impurities containing these metal atoms are easily colloidized. It is likely that the colloidized impurities will not be easily removed with the aforementioned metal ion adsorption member. Accordingly, in a case where a filter for removing particles having a diameter equal to or smaller than 20 nm (for example, a microfiltration membrane having a pore size equal to or smaller than 20 nm) is used, the colloidized impurities can be effectively removed.

The impurities in the form of particles have a size that enables the impurities to be removed by a filter for removing particles having a diameter equal to or smaller than 20 nm. Specifically, the impurities in the form of particles are particles having a diameter equal to or greater than 20 nm.

Particularly, the diameter of the particles to be removed by the aforementioned filter is preferably 1 to 15 nm, and more preferably 1 to 12 nm. In a case where the diameter of the particles to be removed is equal to or smaller than 15 nm, the impurities in the form of finer particles can be removed. In a case where the diameter of particles to be removed is equal to or greater than 1 nm, the filtering efficiency of the solution to be purified is improved.

The diameter of particles to be removed means the minimum size of particles that can be removed by the filter. For example, in a case where the diameter of particles to be removed by the filter is 20 nm, the filter can remove particles having a particle diameter equal to or greater than 20 nm.

Examples of the material of the aforementioned filter include 6-nylon, 6,6-nylon, polyethylene, polypropylene, polystyrene, polyimide and/or polyamide imide, a fluororesin, and the like. The polyimide and/or polyamide imide may have at least one group selected from the group consisting of a carboxy group, a salt-type carboxy group, and a —NH— bond. From the viewpoint of solvent resistance, the polyimide and/or polyamide imide may be fluorinated polyimide and/or fluorinated polyamide imide.

The filtering member may further comprise a filter for removing particles having a diameter equal to or greater than 50 nm (for example, a microfiltration membrane for removing fine particles having a pore size equal to or greater than 50 nm). In a case where fine particles are present in the solution in addition to the colloidized impurities, particularly, colloidized impurities containing metal atoms such as iron or aluminum, by filtering the solution to be purified by using a filter for removing particles having a diameter equal to or greater than 50 nm (for example, a microfiltration membrane for removing fine particles having a pore size equal to or greater than 50 nm) before filtering the solution by using a filter for removing particles having a diameter equal to or smaller than 20 nm (for example, a microfiltration membrane having a pore size equal to or smaller than 20 nm), the filtering efficiency of the filter for removing particles having a diameter equal to or smaller than 20 nm (for example, a microfiltration membrane having a pore size equal to or smaller than 20 nm) is improved, and the coarse particle removing performance is further improved.

The solution to be purified that is obtained through each of the above treatments can be used for composing the solution according to the embodiment of the present invention or can be used as the solution according to the embodiment of the present invention.

Hitherto, as an example of the aforementioned purification step, a case where all of the treatments are performed has been described. However, the present invention is not limited thereto. Each of the treatments may be performed singly, or a plurality of the treatments may be performed in combination. Furthermore, each of the treatments may be performed once or plural times.

As the method for making the content of the metal component and water contained in the solution fall into the desired range, in addition to the above purification step, for example, it is possible to use a method of storing the raw materials of the organic solvent, the stabilizer, and the like that compose the solution or storing the solution in a container which hardly causes the elution of impurities. Furthermore, for example, it is possible to use a method of lining the inner wall of "pipe" with a fluororesin so as to prevent metal components from being eluted from the pipe and the like at the time of manufacturing the solution.

[Container (Storage Container)]

The solution according to the embodiment of the present invention can be stored, transported, and used by being filled into any container as long as corrosiveness and the like do not become issues.

As the container, a container for a semiconductor is preferable which has a high internal cleanliness and hardly causes elution of impurities.

Examples of the usable container include a "CLEAN BOTTLE" series manufactured by AICELLO CORPORATION, "PURE BOTTLE" manufactured by KODAMA PLASTICS Co., Ltd., and the like, but the container is not limited to these. It is preferable that the inner wall of the container is formed of one or more kinds of resins selected from the group consisting of a polyethylene resin, polypropylene resin, and a polyethylene-polypropylene resin, formed of a resin different from the above resin, or formed of a metal having undergone a rust inhibition treatment and a metal elution prevention treatment, such as stainless steel, Hastelloy, inconel, or monel.

As the aforementioned different resin, a fluororesin (perfluororesin) can be preferably used. In a case where a container whose inner wall is formed of a fluororesin among the above materials is used, the occurrence of a problem such as elution of an ethylene or propylene oligomer can be further reduced than in a case where a container whose inner wall is formed of a polyethylene resin, a polypropylene resin, or a polyethylene-polypropylene resin is used.

Specific examples of the container whose inner wall is formed of a fluororesin include FluoroPure PFA composite drum manufactured by Entegris, Inc., and the like. Furthermore, it is possible to use the containers described on p. 4 in JP1991-502677A (JP-H03-502677A), p. 3 in WO2004/016526A, p. 9 and p. 16 in WO99/046309A, and the like.

For the inner wall of the container, in addition to the aforementioned fluororesin, quartz or an electropolished metallic material (that is, a metallic material finished up with electropolishing) is also preferably used.

It is preferable that the metallic material (particularly, the metallic material used for manufacturing the electropolished metallic material) contains chromium in an amount greater than 25% by mass with respect to the total mass of the metallic material, and examples of such a material include stainless steel.

The content of chromium in the metallic material with respect to the total mass of the metallic material is preferably equal to or greater than 30% by mass. The upper limit of the content of chromium is not particularly limited, but is preferably equal to or smaller than 90% by mass in general.

As the stainless steel, known stainless steel can be used without particular limitation. Particularly, an alloy in which the content of nickel is equal to or greater than 8% by mass is preferable, and austenite-based stainless steel in which the content of nickel is equal to or greater than 8% by mass is more preferable. Examples of the austenite-based stainless steel include steel use stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may become higher than the chromium content in the parent phase. Presumably, for this reason, from the inner wall coated with the electropolished metallic material, metal components may not easily leak into the solution, and a solution with reduced metal components (metal impurities) can be obtained. Particularly, a Cr/Fe ratio within the surface of stainless steel constituting the inner wall preferably satisfies $1<Cr/Fe<3$ in terms of an at % ratio. In a case where the Cr/Fe ratio within the surface of the inner wall becoming a solution contact portion contacting the solution is as described above, the metal component in the solution is not easily eluted, and the amount of the metal component (metal impurity) in the solution can be further reduced.

It is preferable that the metallic material is finished up with buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material.

It is preferable that the buffing is performed before the electropolishing.

Furthermore, the metallic material may be obtained by performing one of multiple-stage buffing, which is carried out by changing sizes of abrasive grains and the like, acid washing, magnetic fluid polishing, and the like or obtained by performing two or more kinds of the above processing in combination.

In the present invention, a substance which has the aforementioned container and the aforementioned solution stored in the container is referred to as a solution storage body in some cases.

It is preferable that the interior of the aforementioned container is washed before the container is filled with the solution. In a case where the solution according to the embodiment of the present invention or a solution obtained by diluting the solution according to the embodiment of the present invention is used as a liquid for washing, the effects of the present invention become more apparent. After being manufactured, the solution according to the embodiment of the present invention may be bottled using a container such as a gallon bottle or a quart bottle and transported and stored as it is. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 20° C.

(Clean Room)

It is preferable that all of the manufacturing of the solution according to the embodiment of the present invention, the opening and/or washing of the storage container, the handling including filling with the solution and the like, the treatment and analysis, and the measurement are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

(Filtering)

It is preferable that the solution according to the embodiment of the present invention is subjected to filtering such that the content of the metal component and water falls into the desired range and that foreign substances, coarse particles, and the like are removed.

As a filter used for filtering, those used for filtering in the related art can be used without particular limitation. Examples of materials constituting the filter include a fluororesin such as polytetrafluoroethylene (PTFE), a polyamide-based resin such as nylon, a polyolefin resin (including a high-density polyolefin resin and an ultrahigh molecular-weight polyolefin resin) such as polyethylene and polypropylene (PP), and the like. Among these, a polyamide-based resin, PTFE, and polypropylene (including high-density polypropylene) are preferable. In a case where a filter formed of these materials is used, it is possible to more effectively remove foreign substances having high polarity that readily become the cause of a particle defect and to more efficiently reduce the amount of the metal component (metal impurity).

The lower limit of the critical surface tension of the filter is preferably equal to or higher than 70 mN/m. The upper limit of the critical surface tension of the filter is preferably equal to or lower than 95 mN/m. Particularly, the critical surface tension of the filter is more preferably equal to or higher than 75 mN/m and equal to or lower than 85 mN/m.

The value of the critical surface tension is the nominal value from manufacturers. In a case where a filter having critical surface tension within the above range is used, it is possible to more effectively remove foreign substances having high polarity that readily become the cause of a particle defect and to more efficiently reduce the amount of the metal component (metal impurity).

The filter used for filtering is not particularly limited as long as it has been used for filtering in the related art. Examples of materials constituting the filter include a fluororesin such as polytetrafluoroethylene (PTFE), a polyamide-based resin such as nylon, a polyolefin resin (including a high-density polyolefin resin and an ultrahigh molecular-weight polyolefin resin) such as polyethylene and polypropylene (PP), and the like. Among these, polypropylene (including high-density polypropylene) and nylon are preferable.

The pore size of the filter is preferably about 0.001 to 1.0 µm, more preferably about 0.01 to 0.5 µm, and even more preferably about 0.01 to 0.1 µm. In a case where the pore size of the filter is within the above range, it is possible to reliably remove fine foreign substances contained in the solution while inhibiting filter clogging.

At the time of using the filter, different filters may be combined. At this time, filtering carried out using a first filter may be performed once or performed two or more times. In a case where filtering is performed two or more times by using different filters in combination, the filters may be of the same type or different types, but it is preferable that the filters are of different types. Typically, it is preferable that at least one of the pore size or the constituent material varies between the first filter and the second filter.

It is preferable that the pore size for the second filtering and the next filtering is the same as or smaller than the pore size for the first filtering. Furthermore, first filters having different pore sizes within the above range may be combined. As the pore size mentioned herein, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore size: 0.02 µm, critical surface tension: 77 mN/m)" made of polyamide; (manufactured by Pall Corporation Japan), "PE•CLEAN FILTER (pore size: 0.02 µm)" made of high-density polyethylene; (manufactured by Pall Corporation Japan), and "PE•CLEAN FILTER (pore size: 0.01 µm)" made of high-density polyethylene; (manufactured by Pall Corporation Japan).

For example, from the viewpoint of further improving the effects of the solution according to the embodiment of the present invention and from the viewpoint of inhibiting the increase of particulate metals during the storage of the purified solution, provided that an interaction radius in the Hansen solubility parameter space (HSP) derived from the material of the filter used for filtering is R0, and that a radius of a sphere in the Hansen space derived from the liquid contained in the solution is Ra, it is preferable that the solution used in an aspect of the present application and the material of the filter used for filtering are combined such that the solution and the filter have a relationship satisfying a relational expression of (Ra/R0)≤1, although the combination of the solution and the filter is not particularly limited. Ra/R0 is preferably equal to or smaller than 0.98, and more preferably equal to or smaller than 0.95. The lower limit of the Ra/R0 is preferably equal to or greater than 0.5, more preferably equal to or greater than 0.6, and even more preferably 0.7. In a case where Ra/R0 is within the above range, the formation of a particulate metal or the growth of a particulate metal during long-term storage is inhibited, although the mechanism is unclear.

The combination of the filter and the solution is not particularly limited, and examples thereof include those described in US2016/0089622.

As a second filter, a filter formed of the same material as the aforementioned first filter can be used. Furthermore, a filter having the same pore size as the aforementioned first filter can be used. In a case where a filter having a pore size smaller than that of the first filter is used as the second filter, a ratio between the pore size of the second filter and the pore size of the first filter (pore size of second filter/pore size of first filter) is preferably 0.01 to 0.99, more preferably 0.1 to 0.9, and even more preferably 0.2 to 0.9. In a case where the pore size of the second filter is within the above range, fine foreign substances intermixed with the solution are more reliably removed.

In the present invention, in a case where the content of one kind of metal atom or two or more kinds of metal atoms selected from the group consisting of Na, K, Ca, Fe, Cu, Mg, Mn, Li, Al, Cr, Ni, Pb, and Zn in the solution is particularly small (for example, in a case where the content rate of each of the above metal atoms in the solution is equal to or lower than 1,000 mass ppt), impurities containing these metal atoms tend to be easily colloidized. Therefore, it is likely that the colloidized impurities are not easily removed with an ion adsorption membrane. Therefore, the inventors of the present invention have found that in a case where the solution is purified using a microfiltration membrane having a pore size equal to or smaller than 20 nm, the colloidized impurity components can be removed.

Furthermore, in a case where fine particles are also present in the solution in addition to the colloidized impurities (particularly, colloidized impurities containing a metal atom such as iron or aluminum), it is preferable that the solution is purified by being filtered using a microfiltration membrane for removing fine particles having a pore size equal to or greater than 50 nm, before being filtered using a microfiltration membrane having a pore size equal to or smaller than 20 nm.

It is preferable that the solution according to the embodiment of the present invention is purified using ion adsorption means in addition to the aforementioned filter. The ion adsorption means is preferably constituted with cellulose, diatomite, nylon, polyethylene, polypropylene, polystyrene, or a fluororesin whose surface is modified with either or both of an anionic group such as a sulfo group or a carboxyl group and a cationic group. The ion adsorption means modified with an anionic group can remove a cation such as a Na ion and a Ca ion, and the ion adsorption means modified with a cationic group can remove an anion such as a Cl ion and an acid component. For the ion adsorption means, according to the purpose, an anionic group or a cationic group may be used singly, or an anionic group and a cationic group may be used in combination. The ion adsorption means may be a filter.

The aforementioned filtering step may be repeated plural times according to the purpose.

It is preferable that the filter to be used is treated before filtering the solution. The liquid used for the treatment is not particularly limited. In a case where the solution according to the embodiment of the present invention or a solution obtained by diluting the solution according to the embodiment of the present invention is used, the desired effects of the present invention are more apparently obtained.

In a case where filtering is performed, the upper limit of the temperature at the time of filtering is preferably equal to or lower than room temperature (25° C.), more preferably equal to or lower than 23° C., and even more preferably equal to or lower than 20° C. The lower limit of the temperature at the time of filtering is preferably equal to or higher than 0° C., more preferably equal to or higher than 5° C., and even more preferably equal to or higher than 10° C.

By the filtering, particulate foreign substances or impurities can be removed. In a case where the filtering is performed at the above temperature, the amount of particulate foreign substances and impurities dissolved in the solution is reduced, and hence the filtering is more efficiently performed.

Particularly, from the viewpoint of adjusting the content of the metal component (metal impurity), it is preferable that filtering is performed at the above temperature. It is considered that many of the metal components (metal impurities) may be present in a particulate colloidal state, although the mechanism is unclear. In a case where filtering is performed at the above temperature, some of the metal components (metal impurities) floating in the form of colloid are aggregated, and hence the aggregated metal components are efficiently removed by filtering. It is considered that for this reason, the content of the metal component (metal impurity) can be easily adjusted to be the desired amount.

The filtering pressure affects the filtering accuracy. Therefore, it is preferable that the pulsation of pressure at the time of filtering is as low as possible.

In a case where two or more filters are used, the differential pressure before and after the solution passes through each of the filters (hereinafter, referred to as "differential pressure of filtering" as well) is not particularly limited, but is preferably equal to or lower than 250 kPa and more preferably equal to or lower than 200 kPa. The lower limit thereof is not particularly limited, but is preferably equal to or higher than 50 kPa. In a case where the differential pressure of filtering is equal to or lower than 250 kPa, it is possible to prevent an excessive pressure from being applied to the filter, and hence the eluted substances are expected to be reduced.

In the preparation and purification of the solution according to the embodiment of the present invention, the filtering speed is not particularly limited. However, from the viewpoint of further improving the effects of the present invention, the filtering speed is preferably equal to or higher than 1.0 L/min/m$^2$, more preferably equal to or higher than 0.75 L/min/m$^2$, and even more preferably equal to or higher than 0.6 L/min/m$^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/m$^2$ although the upper limit usually depends on the endurable differential pressure of the filter.

In the preparation and purification of the solution according to the embodiment of the present invention, from the viewpoint of further improving the effects of the present invention, the filtering pressure is preferably equal to or higher than 0.001 Mpa and equal to or lower than 1.0 MPa, more preferably equal to or higher than 0.003 MPa and equal to or lower than 0.5 MPa, and particularly preferably equal to or higher than 0.005 MPa and equal to or lower than 0.3 MPa.

Particularly, in a case where a filter having a small pore size is used, by increasing the filtering pressure, it is possible to efficiently reduce the amount of particulate foreign substances or impurities dissolved in the solution. In a case where a filter having a pore size smaller than 20 nm is used, the filtering pressure is particularly preferably equal to or higher than 0.005 MPa and equal to or lower than 0.3 MPa.

The smaller the pore size of the filtration filter membrane, the lower the filtering speed. However, for example, in a case where a plurality of filters equipped with the same type of filtration filter membrane are connected to each other in parallel, the filtering area is enlarged, and the filtering pressure is reduced. Therefore, in this way, the reduction in the filtering speed can be compensated.

The filter may be washed before being used. The method for washing the filter is not particularly limited, and examples thereof include a method of immersing the filter in a wash solution, a method of causing a wash solution to pass through the filter, and a method obtained by combining these.

In a case where the filter is washed, it is easy to control the amount of components extracted from the filter, and consequently, a solution having the further improved effects of the present invention is obtained.

As the wash solution, known wash solutions can be used without particular limitation. Examples of the wash solution are not particularly limited and include water, an organic solvent, and the like. The organic solvent may be an organic solvent that the solution can contain, such as alkylene glycol monoalkyl ether carboxylate, alkylene glycol monoalkyl ether, lactic acid alkyl ester, alkoxyalkyl propionate, cyclic lactone (preferably having 4 to 10 carbon atoms), a monoketone compound (preferably having 4 to 10 carbon atoms) which may have a ring, alkylene carbonate, alkoxyalkyl acetate, or alkyl pyruvate.

More specifically, examples of the wash solution include propylene glycol monomethyl ether, propylene glycol monomethyl ether acetate, dimethylsulfoxide, n-methylpyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, γ-butyrolactone, a mixture of these, and the like.

Before the washing, a step of wetting the filter with an organic solvent (for example, immersion) may be performed. In a case where the step of wetting the filter with an organic solvent in advance is performed, wet particles are reduced, and hence the filtering efficiency is improved.

The organic solvent used in the wetting step is not particularly limited, and examples thereof include the organic solvents exemplified in the section of <Organic solvent>. Furthermore, although the organic solvent is not particularly limited, in a case where the organic solvent has surface tension lower than that of the solution to be manufactured, the filtering efficiency is improved.

It is preferable that the aforementioned organic solvent and the aforementioned wash solution are high-purity products having a small amount of impurities. The organic solvent and the wash solution may be the same as the solution to be manufactured.

[Electricity Removing Step]

The preparation and purification of the solution according to the embodiment of the present invention may further include an electricity removing step. The electricity removing step is a step of removing electricity from at least one kind of substance (hereinafter, referred to as "purified substance or the like") selected from the group consisting of a raw material, a reactant, and a purified substance such that the charge potential of the purified substance or the like is reduced.

As the electricity removing method, known electricity removing methods can be used without particular limitation. Examples of the electricity removing method include a method of bringing the purified substance or the like into contact with a conductive material.

The contact time for which the purified substance or the like is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method of bringing the purified substance or the like into contact with a conductive material include a method of disposing a grounded mesh formed of a conductive material in the interior of a pipe line and passing the purified substance or the like through the mesh, and the like.

The electricity removing step may be performed at any point in time between the supply of raw materials and the filling of the purified substance. For example, it is preferable that the electricity removing step is performed before at least one step selected from the group consisting of the raw material supply step, the reaction step, the solution preparation step, the purification step, the filtering step, and the filling step. It is particularly preferable that the electricity removing step is performed before the purified substance or the like is filled into the container used in each of the above steps. In a case where the electricity removing step is performed at such a point in time, the impurities derived from the container or the like can be inhibited from being intermixed with the purified substance or the like.

[Actinic Ray-Sensitive or Radiation-Sensitive Resin Composition]

The actinic ray-sensitive or radiation-sensitive resin composition according to the embodiment of the present invention contains the solution according to the embodiment of the present invention.

The makeup of the actinic ray-sensitive or radiation-sensitive resin composition is not particularly limited as long as the composition contains the solution according to the embodiment of the present invention as a diluent of resist materials (solid component, such as a resin, a photoacid generator, and a photopolymerization initiator which are contained in the actinic ray-sensitive or radiation-sensitive resin composition and form a resist film). The actinic ray-sensitive or radiation-sensitive resin composition may be any of a negative composition or a positive composition.

As the resist materials contained in the actinic ray-sensitive or radiation-sensitive resin composition, known materials can be used.

As the resin, a resin whose polarity changes by the action of an acid is particularly preferable. As the resin, a resin P having a repeating unit represented by Formula (AI) is more preferable which is a resin whose solubility in a developer, which contains an organic solvent as a main component, is reduced by the action of an acid. The resin P having a repeating unit represented by Formula (AI) has a group which generates an alkali-soluble group by being decomposed by the action of an acid (hereinafter, referred to as "acid-decomposable group" as well). Particularly, in a case where the solution according to the embodiment of the present invention is used for this type of resin, the permeability of the solution with respect to the resist materials is enhanced, and hence the defect resulting from a development residue is inhibited. Accordingly, the desired effects of the present invention are more apparently obtained.

Examples of the alkali-soluble group include a carboxy group, a fluorinated alcohol group (preferably a hexafluoroisopropanol group), and a sulfonic acid group.

Hereinafter, the resin P will be specifically described.

(Formula (AI): Repeating Unit Having Acid-Decomposable Group)

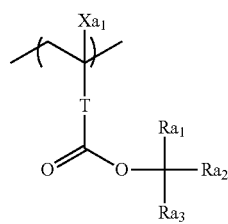

(AI)

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two among $Ra_1$ to $Ra_3$ may form a cycloalkyl group (monocyclic or polycyclic) by being bonded to each other.

Examples of the alkyl group represented by $Xa_1$ which may have a substituent include a methyl group and a group represented by —$CH_2$—$R_{11}$. $R_{11}$ represents a halogen atom (a fluorine atom or the like), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formula, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group represented by $Ra_1$ to $Ra_3$ preferably has 1 to 4 carbon atoms.

The cycloalkyl group represented by $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The cycloalkyl group formed by bonding of two groups among $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group, and more preferably a monocyclic cycloalkyl group having 5 or 6 carbon atoms.

In the cycloalkyl group formed by bonding of two groups among $Ra_1$ to $Ra_3$, for example, one methylene group constituting the ring may be substituted with a heteroatom such as an oxygen atom or a group having a heteroatom such as a carbonyl group.

As the repeating unit represented by Formula (AI), for example, an aspect is preferable in which $Ra_1$ is a methyl group or an ethyl group, and $Ra_2$ and $Ra_3$ form the aforementioned cycloalkyl group by being bonded to each other.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The total content of the repeating unit having an acid-decomposable group with respect to all the repeating units in the resin P is preferably 20 to 90 mol %, more preferably 25 to 85 mol %, and even more preferably 30 to 80 mol %.

Specific examples of the repeating unit having an acid-decomposable group will be shown below, but the present invention is not limited thereto.

In the specific examples, Rx and $Xa_1$ each independently represent a hydrogen atom, $CH_3$, $CF_3$, or $CH_2OH$. Rxa and Rxb each represent an alkyl group having 1 to 4 carbon atoms. Z represents a substituent containing a polar group. In a case where there is a plurality of Z's, Z's are independent from each other. p represents 0 or a positive integer. Examples of the substituent represented by Z containing a polar group include a linear or branched alkyl group or cycloalkyl group having a hydroxyl group, a cyano group, an amino group, an alkyl amide group, a sulfonamide group, and these groups.

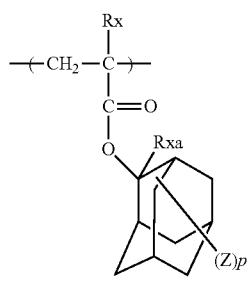

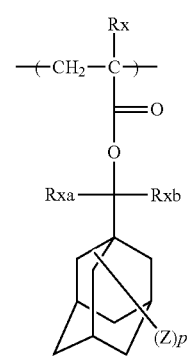

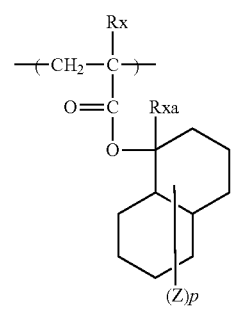

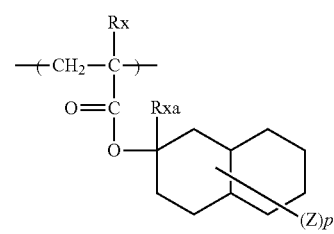

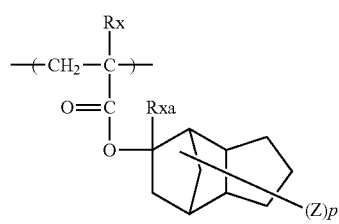

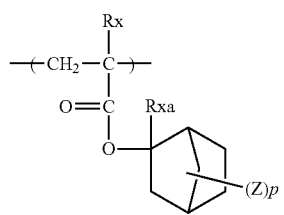 5
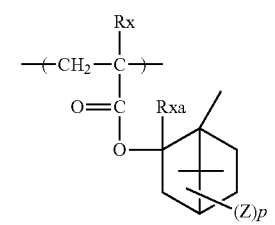 6
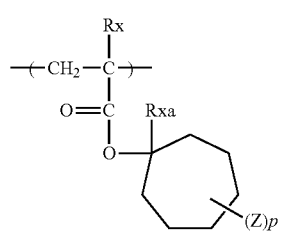 7
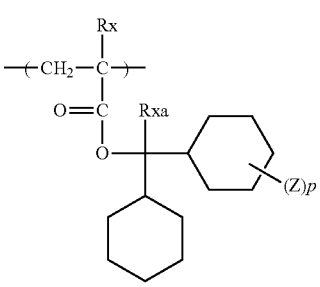 8
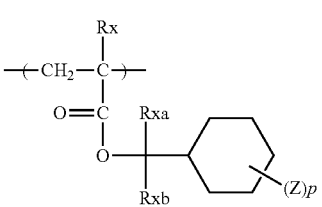 9
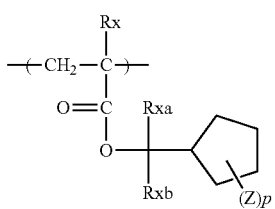 10
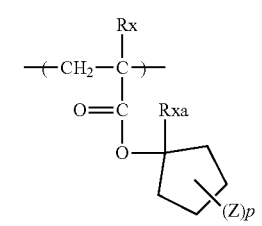 11
12
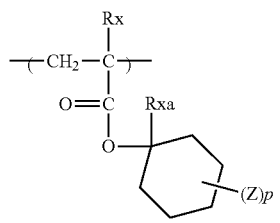 13
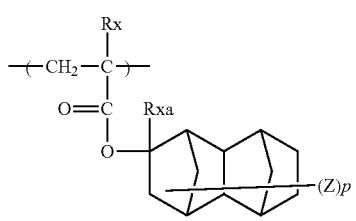 14
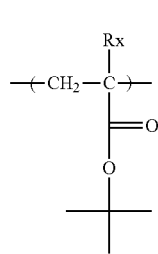 15
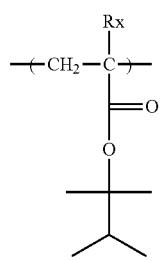 16
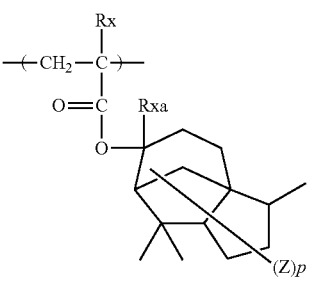 17
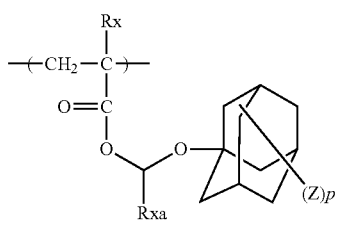 18

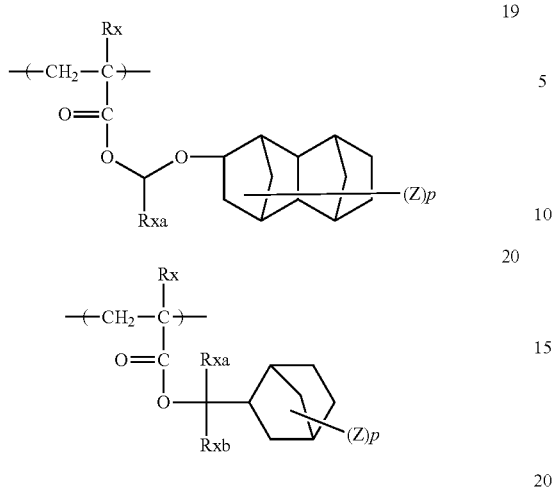

19

20

(Repeating Unit Having Lactone Structure)

It is preferable that the resin P contains a repeating unit Q having a lactone structure.

The repeating unit Q having a lactone structure preferably has a lactone structure on a side chain. For example, the repeating unit Q is more preferably a repeating unit derived from a (meth)acrylic acid derivative monomer.

One kind of repeating unit Q having a lactone structure may be used singly, or two or more kinds of repeating units Q may be used in combination. It is preferable to use one kind of repeating unit Q.

The content of the repeating unit Q having a lactone structure with respect to all the repeating units in the resin P is, for example, 3 to 80 mol %, and preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulae (LC1-1) to (LC1-17). As the lactone structure, a lactone structure represented by Formula (LC1-1), Formula (LC1-4), Formula (LC1-5), or Formula (LC1-8) is preferable, and a lactone structure represented by Formula (LC1-4) is more preferable.

LC1-1

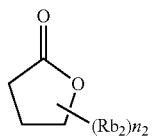

LC1-2

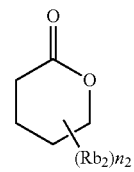

LC1-3

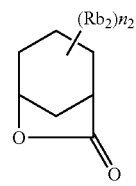

LC1-4

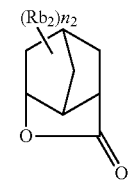

LC1-5

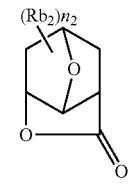

LC1-6

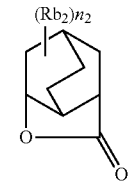

LC1-7

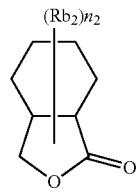

LC1-8

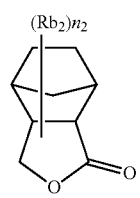

LC1-9

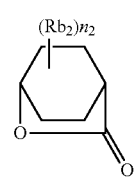

LC1-10

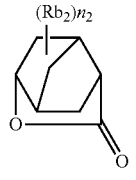

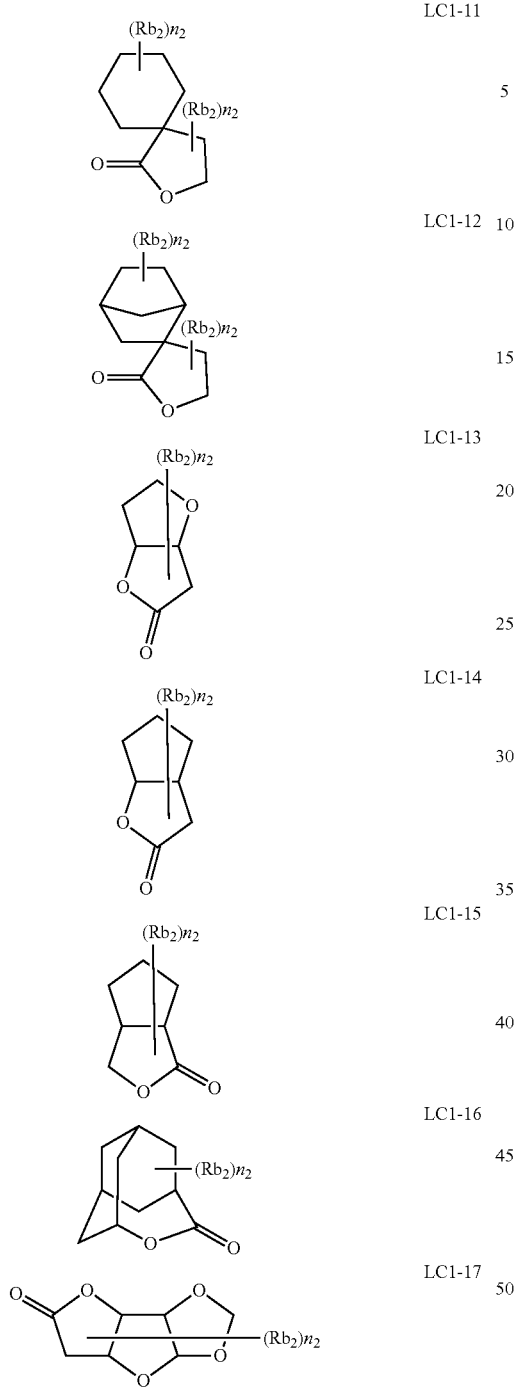

The lactone structure portion may have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents ($Rb_2$) may be the same as or different from each other, and a plurality of substituents ($Rb_2$) may form a ring by being bonded to each other.

The resin P is particularly preferably a resin represented by Formula (I). The resin represented by Formula (I) is a resin formed of a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e).

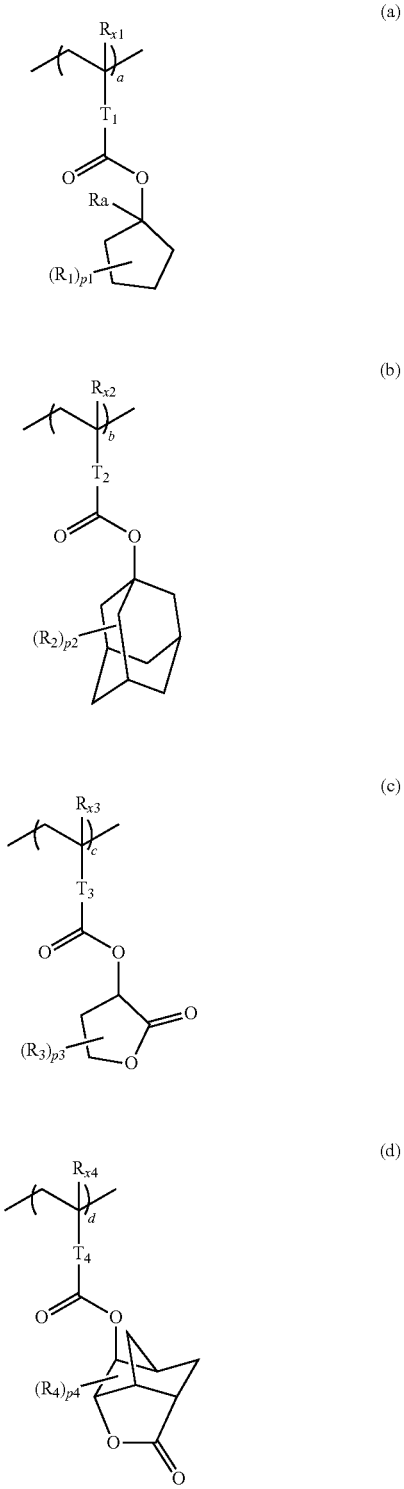

-continued

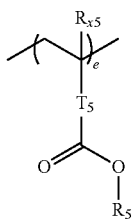

(e)

In Formula (I), $R_{x1}$ to $R_{x5}$ each independently represent a hydrogen atom or an alkyl group which may have a substituent.

$R_1$ to $R_4$ each represent a monovalent substituent, and $p_1$ to $p_4$ each independently represent 0 or a positive integer.

$R_a$ represents a linear or branched alkyl group.

$T_1$ to $T_5$ each represent a single bond or a divalent linking group.

$R_5$ represents a monovalent organic group.

a to e each represent mol %. a to e each independently represent a number included in a range of $0 \leq a \leq 100$, $0 \leq b \leq 100$, $0 \leq c < 100$, $0 \leq d < 100$, or $0 \leq e < 100$. Here, $a+b+c+d+e=100$, and $a+b \neq 0$.

In Formula (I), the repeating unit (e) has a structure different from all of the repeating units (a) to (d).

In Formula (I), $R_{x1}$ to $R_{x5}$ have the same definition as $Xa_1$ in Formula (AI), and the suitable aspect thereof is also the same.

In Formula (I), $T_1$ to $T_5$ have the same definition as T in Formula (AI), and the suitable aspect thereof is also the same.

In Formula (I), $R_a$ represents a linear or branched alkyl group. Examples thereof include a methyl group, an ethyl group, a t-butyl group, and the like. Among these, a linear or branched alkyl group having 1 to 4 carbon atoms is preferable.

In Formula (I), $R_1$ to $R_4$ each represent a monovalent substituent. $R_1$ to $R_4$ are not particularly limited, and examples thereof include a hydroxyl group, a cyano group, and a linear or branched alkyl group or cycloalkyl group having a hydroxyl group, a cyano group, or the like.

In Formula (I), $p_1$ to $p_4$ each independently represent 0 or a positive integer. The upper limit of p equals the number of hydrogen atoms which can be substituted in each repeating unit.

In Formula (I), $R_5$ represents a monovalent organic group. $R_5$ is not particularly limited, and examples thereof include a monovalent organic group having a sultone structure and a monovalent organic group having a cyclic ether such as dioxolane.

In Formula (I), a to e each represent mol %. a to e each independently represent a number included in a range of $0 \leq a \leq 100$, $0 \leq b \leq 100$, $0 \leq c < 100$, $0 \leq d < 100$, or $0 \leq e < 100$. Here, $a+b+c+d+e=100$, and $a+b \neq 0$. A preferable range of each of the content of the repeating unit having an acid-decomposable group and the content of the repeating unit having a lactone structure with respect to all the repeating units in Formula (I) is as described above.

The resin P may contain a repeating unit having a sultone structure.

As all of other components (for example, an acid generator, a basic compound, a quencher, a solvent, and the like) contained in the actinic ray-sensitive or radiation-sensitive resin composition, known components can be used. As the actinic ray-sensitive or radiation-sensitive resin composition, for example, the resist compositions described in JP2016-057614A, JP2014-219664A, JP2016-138219A, and JP2015-135379A can be preferably used.

[Pattern Forming Method]

The pattern forming method according to the embodiment of the present invention includes (i) resist film forming step of forming a resist film by using an actinic ray-sensitive or radiation-sensitive resin composition (ii) exposure step of exposing the resist film, and (iii) development step of developing the exposed resist film by using a developer and further includes, as an optional step, (iv) step of bringing a prewet solution into contact with a substrate before (i) resist film forming step (that is, before the substrate is coated with the actinic ray-sensitive or radiation-sensitive resin composition), in which the solution according to the embodiment of the present invention is used in any one or more steps among (i) resist film forming step, (iii) development step, and (iv) prewet step.

Hereinafter, aspects will be shown in which the solution according to the embodiment of the present invention is used in each of (i) resist film forming step, (iii) development step, and (iv) prewet step described above.

(1) Step of forming resist film on substrate by means of coating by using actinic ray-sensitive or radiation-sensitive resin composition containing the solution according to the embodiment of the present invention (2) Step of developing exposed resist film (exposed film) by using solution according to the embodiment of the present invention as developer (3) step of bringing solution according to the embodiment of the present invention into contact with the substrate as prewet solution before the substrate is coated with actinic ray-sensitive or radiation-sensitive resin composition The pattern forming method can be performed by known methods by using known materials.

Furthermore, for example, in a case where the solution according to the embodiment of the present invention is used in (1) resist film forming step described above, as long as the solution according to the embodiment of the present invention is used as an organic solvent which is used as a diluent in a known actinic ray-sensitive or radiation-sensitive resin composition, as other materials and the technique for forming the resist film, known materials and techniques may be adopted.

In a case where the solution according to the embodiment of the present invention is used in (2) development step described above, as long as the solution according to the embodiment of the present invention is used as the developer, and the development method may be performed according to a known method.

In a case where the solution according to the embodiment of the present invention is used in (3) prewet step described above, as long as the solution according to the embodiment of the present invention is used as the prewet solution, the prewet method may be performed according to a known method.

It is preferable that in the pattern forming method according to the embodiment of the present invention, after (i) resist film forming step, (v) prebaking step (PB; Prebake) is additionally performed before (ii) exposure step.

Furthermore, it is preferable that in the pattern forming method according to the embodiment of the present invention, after (ii) exposure step, (vi) post exposure baking step (PEB; Post Exposure Bake) is additionally performed before (iii) development step.

By the aforementioned baking steps, the stabilizer is volatilized, and hence the defect inhibition properties can be further improved.

For both the PB and the PEB, the heating temperature is preferably 70° C. to 130° C., and more preferably 80° C. to 120° C.

For both the PB and the PEB, the heating time is preferably 30 to 300 seconds, more preferably 30 to 180 seconds, and even more preferably 30 to 90 seconds.

The heating can be performed by means comprising general exposure machine and developing machine, and a hot plate and the like may also be used.

[Manufacturing Method of Electronic Device]

The present invention also relates to a manufacturing method of a semiconductor device including the aforementioned pattern forming method according to the embodiment of the present invention. The semiconductor device manufactured by the manufacturing method of a semiconductor device according to the embodiment of the present invention is suitably mounted on electric and electronic instruments (for example, home appliances, office automation (OA)-related instruments, media-related instruments, optical instruments, communication instruments, and the like).

EXAMPLES

Hereinafter, the present invention will be more specifically described based on examples. The materials, the amount of the materials used, the proportion of the materials, the treatment contents, the treatment procedure, and the like shown in the following examples can be appropriately modified as long as the gist of the present invention is maintained. Accordingly, the scope of the present invention is not limited to the following examples. Unless otherwise specified, "%", "ppt", and "ppm" are based on mass.

[Preparation of Solution]

Each of the solutions of examples and comparative examples was prepared by performing the following purification step on a raw material solution.

As the purification step for the aforementioned mixed solution (hereinafter, referred to as "solution to be purified"), the following steps (1) to (5) were performed in this order.

(1) Dehydration treatment of performing dehydration (volatilization removal by heating)

(2) Distillation treatment of distilling solution to be purified having undergone dehydration treatment (3) First ion exchange treatment of performing ion exchange treatment on solution to be purified by using 15 nm ion-exchange (IEX) PTFE filter manufactured by Entegris, Inc.

(4) Second ion exchange treatment of performing ion exchange treatment on solution to be purified having undergone distillation treatment by using 12 nm PTFE filter manufactured by Entegris, Inc.

(5) Particle removing treatment of optionally removing particles by performing ultrafiltration under the condition of pressure of 0.05 to 0.3 Pa by using 3 nm PTFE filter manufactured by Entegris, Inc.

For the solution shown in Table 1 which had not yet been subjected to (2) purification described above and in which the amount of a stabilizer was 0 ppm, a stabilizer was added to the solution after (2) purification. Furthermore, for an organic solvent which already contained a stabilizer at the time of being purchased, after the amount of the stabilizer was adjusted by performing (2) purification, the organic solvent was used for evaluation.

As any of the organic solvents and the stabilizers shown in Table 1, those classified as a semiconductor grade or classified as a high-purity grade equivalent to the semiconductor grade were used.

At the time of preparing each of the solutions of examples and comparative examples, all of the preparation, filling, storage, and analytical measurement of the solutions were performed in a clean room that met the level equal to or lower than ISO Class 2. Furthermore, in examples, containers were used after being washed in advance with the solution according to the embodiment of the present invention. In order to improve the measurement accuracy, at the time of measuring the content of the organic impurity, measuring the content of the stabilizer, measuring the content of the peroxide, and measuring the content of the metal component, in a case where the content of the organic impurity, the stabilizer, the peroxide, or the metal component was found to be equal to or smaller than a detection limit by general measurement, the solution was concentrated by 1/100 in terms of volume for performing the measurement, and the content was calculated by converting the concentration into the concentration of the solution not yet being concentrated.

In addition, for measuring the metal component (metal impurity) in the solution of Example 41, the following steps (1) to (3) were performed.

(1) First, 1 L of the solution of Example 41 was evaporated from the surface of a clean substrate.

(2) Then, the residual components on the substrate were washed off with another solution for which the initial amount of the metal component was measured, and the solution used for washing was recovered.

(3) By ICP-MS method, which will be described later, the content of the metal component contained in the recovered solution was measured, and a difference with the initial amount of the metal component was adopted as the amount of the metal component (amount of the metal impurity).

The components used for preparing each of the solutions of examples and comparative examples are as below.

<Stabilizer>

(Antioxidant)

BHT: dibutyl hydroxytoluene (boiling point: 265° C.)

DLTP: didodecyl 3,3'-thiodipropionate (boiling point: 562.9° C.)

DSTP: dioctadecyl 3,3'-thiodipropionate (boiling point: 704.8° C.)

BFN: 4,4'-butylidenebis(6-t-butyl-3-methylphenol) (boiling point: 475° C.)

MBF: 2,2'-methylenebis-(4-ethyl-6-t-butylphenol) (boiling point: 187.5° C.)

HQ: hydroquinone (boiling point: 287° C.)

tEHP: tris(2-ethylhexyl)phosphite (boiling point: 447° C.)

HMBP: 2-hydroxy-4-methoxybenzophenone (boiling point: 155° C.)

BHA: butyl hydroxyanisole (boiling point: 264° C.)

(Metal chelating agent)

EDTA: ethylenediamine tetraacetic acid (boiling point: 614° C.)

DTPA: diethylenetriamine pentaacetic acid (boiling point: 721° C.)

Stabilizer A: 9,10-dihydro-9-oxa-10-phosphophenanthrene-10-oxide (boiling point: 592° C.)

DHEG: dihydroxyethyl glycerin (boiling point: 388° C.)

CA: citric acid (boiling point: 153° C.)

Gallic Acid (boiling point: 501° C.)

EDTP: ethylenediamine tetrapropionic acid (boiling point: 240° C.)

<Organic Solvent>
PGMEA: propylene glycol monomethyl ether acetate
PGME: propylene glycol monomethyl ether
PGEE: propylene glycol monoethyl ether
PGPE: propylene glycol monopropyl ether
EL: ethyl lactate
CyPe: cyclopentanone
CyHe: cyclohexanone
γ-BL: γ-butyrolactone
nBA: butyl acetate
MIBC: 4-methyl-2-pentanol
Dox: 1,4-dioxane
THF: tetrahydrofuran
PC: propylene carbonate
MMP: methyl 3-methoxypropionate Each of the obtained solutions of Examples 1 to 66 and Comparative Examples 1 and 2 was stored in a container whose inner wall as a solution contact portion was formed of stainless steel. The Cr/Fe ratio within the surface of the stainless steel (surface contacting the solution) constituting the solution contact portion satisfied 1<Cr/Fe<3 in terms of an at % ratio. The solution of Example 39 was stored in a container in which the Cr/Fe ratio within the surface of the stainless steel constituting the solution contact portion satisfied Cr/Fe<1 in terms of an at % ratio, and the solution of Example 40 was stored in a container in which the Cr/Fe ratio within the surface of the stainless steel constituting the solution contact portion satisfied 3<Cr/Fe in terms of an at % ratio.

(Measurement of Content of Organic Impurity)

By using each of the solutions of examples and comparative examples, the content of the organic impurity (content with respect to the total mass of the solution) in the solution was measured. The content was measured using GC-MS (trade name "GCMS-2020", manufactured by Shimadzu Corporation) and determined by an area normalization method. The measurement results are shown in Table 1.

Many of organic impurities detected by GC-MS measurement are alcohols used as raw materials for synthesizing an organic solvent (see the column of "organic impurity after purification (mass ppm)" in Table 1). For example, in a case where butyl acetate is used as a solvent, n-butanol is frequently detected as an organic impurity. Furthermore, in a case where PGMEA is used as a solvent, propylene glycol is frequently detected as an organic impurity.

(Measurement of Content of Stabilizer)

By using each of the solutions of examples and comparative examples, the content of the stabilizer (content with respect to the total mass of the solution) in the solution was measured. The content was measured using GC-MS (trade name "GCMS-2020", manufactured by Shimadzu Corporation) and determined by an area normalization method. The measurement results are shown in Table 1.

(Measurement of Content of Peroxide)

By using each of the solutions of examples and comparative examples, the content of the peroxide (content with respect to the total mass of the solution) in the solution was measured. The content was measured using GC-MS (trade name "GCMS-2020", manufactured by Shimadzu Corporation) and determined by an area normalization method. The measurement results are shown in Table 1.

(Measurement of Content of Water)

By using each of the solutions of examples and comparative examples, the content of water in the solution (content with respect to the total mass of the solution) was measured. The content of water was measured using a Karl Fischer moisture meter (trade name "MKC-710M", manufactured by KYOTO ELECTRONICS MANUFACTURING CO., LTD., for Karl Fischer coulometric titration method). The measurement results are shown in Table 1.

(Measurement of Content of Metal Component (Fe Element, Cr Element, Ni Element, and Pb Element))

By using each of the solutions of examples and comparative examples, the content of the metal component (metal impurity) in the solution (content with respect to the total mass of the solution) was measured. Specifically, the content was measured by an ICP-MS method by using each of the solutions of examples and comparative examples and NexION 350S (trade name, manufactured by PerkinElmer Inc.). The measurement results are shown in Table 1.

Specifically, the conditions of the measurement by the ICP-MS method are as below.

A detectable amount was measured based on the peak intensity for a standard solution having known concentration and converted into the mass of the metal element, and the content of each metal element in the solution used for the measurement was calculated.

(Conditions of Measurement by ICP-MS Method)

((Standard Substance))

Ultrapure water was measured and put into a clean glass container, and metal particles to be measured that had a median diameter of 50 nm were added thereto such that the concentration thereof became 1 mass ppt, and then the solution was treated for 30 minutes in an ultrasonic washing machine. A dispersion liquid obtained in this way was used as a standard substance for measuring transport efficiency.

((ICP-MS Device Used))

Manufacturer: PerkinElmer Inc.

Model: NexION 350S ((Measurement Conditions of ICP-MS))

For ICP-MS, by using a coaxial nebulizer made of PFA ("PFA" is a copolymer of tetrafluoroethylene and perfluoroalkyl vinyl ether), a cyclonic spray chamber made of quartz, and a torch injector made of quartz having an inner diameter of 1 mm, a solution to be measured was aspirated at 0.2 mL/min. Oxygen was added in an amount of 0.1 L/min, a plasma output was 1,600 W, and cell purging was performed using ammonia gas. The analysis was performed at a temporal resolution of 50 μs.

((Software))

The content of the metal element was measured using the following attached analysis software provided from the manufacturer.

Syngistix for ICP-MS software (Number of Coarse Particles)

By using each of the solutions of examples and comparative examples, the number of coarse particles in the solution was measured.

After being prepared, the aforementioned solution was left to stand for 1 day at room temperature. Then, based on a dynamic light scattering method, by using a light scattering-type liquid-borne particle counter (manufactured by RION Co., Ltd., model number: KS-18F, light source: semiconductor laser-excited solid-state laser (wavelength: 532 nm, rated power: 500 mW), flow rate: 10 mL/min), the number of objects to be counted having a size equal to or greater than 0.1 μm that were contained in 1 mL of the solution was counted 5 times, and the average thereof was adopted as a measured value.

The light scattering-type liquid-borne particle counter was used after being calibrated using a polystyrene latex (PSL) standard particle solution.

(Defect Evaluation Test)

By using a wafer surface inspection device (SP-5; manufactured by KLA-Tencor Corporation.), the number of particles (hereinafter, referred to as "defects") having a diameter equal to or greater than 19 nm that were present on the surface of a silicon oxide film substrate having a diameter of 300 mm were counted. Then, the silicon oxide film substrate was set in a spin jetting device, and while the silicon oxide film substrate was being rotated, each of the solutions of examples or comparative examples was jetted to the surface of the same substrate at a flow rate of 1.5 L/min. Thereafter, the wafer was spin-dried and then a heating and drying step (190° C.).

For the obtained dried wafer, by using the aforementioned device (SP-5), the number of defects present on the surface of the silicon oxide film substrate was counted again, and a difference with the initial value (counted value–counted value) was adopted as the number of defects.

Table 1 shows the result obtained by evaluating the obtained number of defects based on the following standards. In a case where the evaluation result is "C" or better based on the following standards, the solution is considered as achieving a defect inhibition ability required for various solutions used for manufacturing a semiconductor device.

(Evaluation Standards)

"AA": the number of defects is equal to or smaller than 200.

"A": the number of defects is greater than 200 and equal to or smaller than 500.

"B": the number of defects is greater than 500 and equal to or smaller than 1,000.

"C": the number of defects is greater than 1,000 and equal to or smaller than 1,500.

"D": the number of defects is greater than 1,500.

The wafer surface inspection device (SP-5; manufactured by KLA-Tencor Corporation.) is a device which detects a foreign substance or a pattern defect on a wafer and determines position coordinates (X, Y) of the defect. The defect includes a random defect and a systematic defect. The random defect occurs mainly by the adhesion of a foreign substance or the like. Accordingly, it is impossible to predict where such a defect will occur. Therefore, the primary role of the inspection device is to detect a defect on a wafer and to specify the location (position coordinates).

Particularly, SP-5 used in the present invention is a device for detecting a defect on a bare wafer and is effective for detecting a random defect. The device performs measurement based on a principle in which laser beams are shot to a rotating wafer and (relatively) moved in the radial direction such that the entire surface of the wafer is irradiated with the laser beams. At this time, in a case where the laser beams touch a foreign substance or a defect due to the rotation of the wafer, light is scattered, and the scattered light is detected by a detector. In this way, a foreign substance and a defect are detected. Based on the rotation angle of the wafer and the radial position of the laser beams, the coordinate positions of the foreign substance and the defect are assigned and registered.

Particularly, for evaluating defects relating to the manufacturing of a fine semiconductor device at a node equal to or smaller than 10 nm, it is preferable to use a wafer surface inspection device having resolution equal to or higher than that of SP-5.

(Stability Test for Organic Solvent in Solution)

First, the content of the organic solvent contained in an immediately prepared solution was measured using GC-MS (trade name "GCMS-2020", manufactured by Shimadzu Corporation) and determined by an area normalization method. Then, the content of the organic solvent contained in a solution left to stand for 1 month at 25° C. after being prepared was measured by the same method as described above.

Furthermore, based on Expression (1), a ratio between the content of the organic solvent contained in the immediately prepared solution and the content of the organic solvent contained in the solution left to stand for 1 month at 25° C. after being prepared was calculated, and the temporal stability of the organic solvent in the solution was evaluated according to the evaluation standards which will be described later. In a case where the evaluation result is "B" or better based on the following standards, the solution is considered as achieving temporal stability required for various solutions used for manufacturing a semiconductor device.

(content of organic solvent contained in solution left to stand for 1 month at 25° C. after being prepared (unit: mass ppt))/(content of organic solvent contained in immediately prepared solvent (unit: mass ppt))  Expression (1):

(Evaluation Standards)

"A": higher than 0.99 and equal to or lower than 1.00
"B": higher than 0.97 and equal to or lower than 0.99
"C": equal to or lower than 0.97

In the following Table 1, the content of a first organic solvent means "balance portion (% by mass)". That is, the content of the first organic solvent equals the amount (% by mass) obtained by subtracting the content (% by mass) of components other than the first organic solvent from the total mass of the solution.

In the following tables, "ppm" and "ppt" are based on mass. Furthermore, "wt %" means % by mass.

TABLE 1

| | Organic solvent | | | Stabilizer before purification | | Stabilizer after purification | | Organic impurity after purification | | Peroxide after purification (mass ppt) |
|---|---|---|---|---|---|---|---|---|---|---|
| | First organic solvent (% by mass) | Second organic solvent (% by mass) | Third organic solvent (% by mass) | First stabilizer (mass ppm) | Second stabilizer (mass ppm) | First stabilizer (mass ppm) | Second stabilizer (mass ppm) | Type | Content (mass ppm) | |
| Example 1 | PGMEA | — | — | BHT 3 ppm | — | BHT 3 ppm | — | Propylene glycol | 1,000 ppm | 5 |
| Example 2 | PGMEA | — | — | BHT 3 ppm | — | BHT 3 ppm | — | Propylene glycol | 1,000 ppm | 5 |

TABLE 1-continued

| | | | | | | | | | | |
|---|---|---|---|---|---|---|---|---|---|---|
| Example 3 | PGMEA | — | — | BHT 3 ppm | — | BHT 3 ppm | — | Propylene glycol | 1,000 ppm | 5 |
| Example 4 | PGMEA | — | — | BHT 3 ppm | — | BHT 3 ppm | — | Propylene glycol | 1,000 ppm | 5 |
| Example 5 | PGMEA | — | — | BHT 3 ppm | — | BHT 3 ppm | — | Propylene glycol | 1,000 ppm | 5 |
| Example 6 | PGMEA | — | — | BHT 3 ppm | — | BHT 3 ppm | — | Propylene glycol | 4,000 ppm | 6 |
| Example 7 | PGMEA | — | — | BHT 3 ppm | — | BHT 3 ppm | — | Propylene glycol | 20,000 ppm | 5 |
| Example 8 | PGMEA | — | — | BHT 3 ppm | — | BHT 3 ppm | — | Propylene glycol | 1,000 ppm | 5 |
| Example 9 | PGMEA | — | — | BHT 3 ppm | — | BHT 3 ppm | — | Propylene glycol | 1,000 ppm | 5 |
| Example 10 | PGMEA | — | — | BHT 3 ppm | — | BHT 3 ppm | — | Propylene glycol | 1,000 ppm | 5 |
| Example 11 | PGMEA | — | — | BHT 10 ppm | — | BHT 10 ppm | — | Propylene glycol | 1,000 ppm | 3 |
| Example 12 | PGMEA | — | — | BHT 20 ppm | — | BHT 20 ppm | — | Propylene glycol | 1,000 ppm | 2 |
| Example 13 | PGMEA | — | — | BHT 40 ppm | — | BHT 40 ppm | — | Propylene glycol | 1,000 ppm | 2 |
| Example 14 | PGMEA | — | — | DLTP 5 ppm | — | DLTP 5 ppm | — | Propylene glycol | 1,000 ppm | 3 |
| Example 15 | PGMEA | — | — | DSTP 5 ppm | — | DSTP 5 ppm | — | Propylene glycol | 1,000 ppm | 5 |

Table 1

| | Moisture after purification (% by mass) | Number of times of ion exchange resin treatment | Metal impurity after purification | | | | | Number of times of ultrafiltration treatment | Number of coarse particles after purification (/ml) | Specification of SUS container | Evaluation | |
|---|---|---|---|---|---|---|---|---|---|---|---|---|
| | | | Fe (mass ppt) | Cr (mass ppt) | Ni (mass ppt) | Pb (mass ppt) | Total (mass ppt) | | | | Defect inhibition properties | Stability of solution |
| Example 1 | 0.10% | 4 | 2 | 1 | 3 | 1 | 7 | 3 | 10 | 1 < Cr/Fe < 3 | AA | A |
| Example 2 | 0.10% | 3 | 4 | 2 | 5 | 2 | 13 | 3 | 10 | 1 < Cr/Fe < 3 | A | A |
| Example 3 | 0.10% | 2 | 20 | 10 | 26 | 8 | 64 | 3 | 10 | 1 < Cr/Fe < 3 | A | A |
| Example 4 | 0.10% | 1 | 312 | 121 | 344 | 103 | 880 | 3 | 10 | 1 < Cr/Fe < 3 | B | B |
| Example 5 | 0.10% | 0 | 482 | 172 | 502 | 166 | 1,322 | 3 | 10 | 1 < Cr/Fe < 3 | C | B |
| Example 6 | 0.10% | 4 | 2 | 2 | 2 | 1 | 7 | 3 | 9 | 1 < Cr/Fe < 3 | AA | A |
| Example 7 | 0.10% | 4 | 3 | 1 | 4 | 1 | 9 | 3 | 15 | 1 < Cr/Fe < 3 | B | B |
| Example 8 | 0.10% | 4 | 2 | 1 | 3 | 1 | 7 | 2 | 60 | 1 < Cr/Fe < 3 | A | A |
| Example 9 | 0.10% | 4 | 2 | 1 | 3 | 1 | 7 | 1 | 130 | 1 < Cr/Fe < 3 | B | A |
| Example 10 | 0.10% | 4 | 2 | 1 | 3 | 1 | 7 | 0 | 200 | 1 < Cr/Fe < 3 | B | A |
| Example 11 | 0.10% | 4 | 2 | 2 | 2 | 1 | 7 | 3 | 20 | 1 < Cr/Fe < 3 | AA | A |
| Example 12 | 0.10% | 4 | 1 | 1 | 4 | 1 | 7 | 3 | 10 | 1 < Cr/Fe < 3 | A | A |
| Example 13 | 0.10% | 4 | 1 | 1 | 4 | 1 | 7 | 3 | 9 | 1 < Cr/Fe < 3 | B | A |
| Example 14 | 0.10% | 4 | 3 | 1 | 4 | 1 | 9 | 3 | 10 | 1 < Cr/Fe < 3 | B | A |
| Example 15 | 0.10% | 4 | 2 | 2 | 2 | 1 | 7 | 3 | 10 | 1 < Cr/Fe < 3 | B | A |

TABLE 2

Continued from Table 1

| | Organic solvent | | | Stabilizer before purification | | Stabilizer after purification | | Organic impurity after purification | | Peroxide after purification (mass ppt) |
|---|---|---|---|---|---|---|---|---|---|---|
| | First organic solvent (% by mass) | Second organic solvent (% by mass) | Third organic solvent (% by mass) | First stabilizer (mass ppm) | Second stabilizer (mass ppm) | First stabilizer (mass ppm) | Second stabilizer (mass ppm) | Type | Content (mass ppm) | |
| Example 16 | PGMEA | — | — | BFN 5 ppm | — | BFN 5 ppm | — | Propylene glycol | 1,000 ppm | 4 |
| Example 17 | PGMEA | — | — | MBF 5 ppm | — | MBF 5 ppm | — | Propylene glycol | 1,000 ppm | 5 |
| Example 18 | PGMEA | — | — | BHT 3 ppm | DLTP 3 ppm | BHT 3 ppm | DLTP 3 ppm | Propylene glycol | 1,000 ppm | 5 |
| Example 19 | PGMEA | — | — | (Stabilizer A) 3 ppm | — | (Stabilizer A) 3 ppm | — | Propylene glycol | 1,000 ppm | 9 |
| Example 20 | PGMEA | — | — | EDTA 3 ppm | — | EDTA 3 ppm | — | Propylene glycol | 1,000 ppm | 10 |
| Example 21 | PGME | — | — | BHT 3 ppm | — | BHT 3 ppm | — | Methanol | 1,000 ppm | 6 |
| Example 22 | PGEE | — | — | BHT 3 ppm | — | BHT 3 ppm | — | Ethanol | 1,000 ppm | 7 |
| Example 23 | PGPE | — | — | BHT 3 ppm | — | BHT 3 ppm | — | Propanol | 1,000 ppm | 7 |
| Example 24 | EL | — | — | BHT 3 ppm | — | BHT 3 ppm | — | Ethanol | 1,000 ppm | 8 |
| Example 25 | CyPe | — | — | BHT 3 ppm | — | BHT 3 ppm | — | Cyclopentanol | 1,000 ppm | 6 |
| Example 26 | CyHe | — | — | BHT 3 ppm | — | BHT 3 ppm | — | Cyclohexanol | 1,000 ppm | 5 |
| Example 27 | γ-BL | — | — | BHT 3 ppm | — | BHT 3 ppm | — | γ-Hydroxy-butyrate | 1,000 ppm | 8 |
| Example 28 | nBA | — | — | BHT 3 ppm | — | BHT 3 ppm | — | 1-Butanol | 1,000 ppm | 10 |
| Example 29 | MIBC | — | — | BHT 3 ppm | — | BHT 3 ppm | — | 1-Methyl butanol | 1,000 ppm | 10 |
| Example 30 | Dox | — | — | BHT 3 ppm | — | BHT 3 ppm | — | 1,2-Dioxane 1,3-Dioxane | 1,000 ppm | 6 |
| Example 31 | THF | — | — | BHT 3 ppm | — | BHT 3 ppm | — | 1,4-Butanediol | 1,000 ppm | 5 |

Continued from Table 1

| | Moisture after purification (% by mass) | Number of times of ion exchange resin treatment | Metal impurity after purification | | | | | Number of times of ultrafiltraiton treatment | Number of coarse particles after purification (/ml) | Specification of SUS container | Evaluation | |
|---|---|---|---|---|---|---|---|---|---|---|---|---|
| | | | Fe (mass ppt) | Cr (mass ppt) | Ni (mass ppt) | Pb (mass ppt) | Total (mass ppt) | | | | Defect inhibition properties | Stability of solution |
| Example 16 | 0.10% | 4 | 2 | 3 | 3 | 1 | 9 | 3 | 10 | 1 < Cr/Fe < 3 | A | A |
| Example 17 | 0.10% | 4 | 3 | 2 | 2 | 1 | 8 | 3 | 10 | 1 < Cr/Fe < 3 | AA | A |
| Example 18 | 0.10% | 4 | 3 | 2 | 2 | 1 | 8 | 3 | 10 | 1 < Cr/Fe < 3 | B | A |
| Example 19 | 0.10% | 4 | 3 | 1 | 4 | 1 | 9 | 3 | 10 | 1 < Cr/Fe < 3 | B | B |
| Example 20 | 0.10% | 4 | 2 | 2 | 2 | 1 | 7 | 3 | 11 | 1 < Cr/Fe < 3 | B | B |
| Example 21 | 0.10% | 4 | 2 | 1 | 3 | 1 | 7 | 3 | 10 | 1 < Cr/Fe < 3 | A | A |
| Example 22 | 0.10% | 4 | 2 | 1 | 3 | 1 | 7 | 3 | 10 | 1 < Cr/Fe < 3 | A | A |
| Example 23 | 0.10% | 4 | 2 | 1 | 3 | 1 | 7 | 3 | 10 | 1 < Cr/Fe < 3 | A | A |
| Example 24 | 0.10% | 4 | 2 | 1 | 3 | 1 | 7 | 3 | 11 | 1 < Cr/Fe < 3 | A | A |
| Example 25 | 0.10% | 4 | 2 | 1 | 3 | 1 | 7 | 3 | 10 | 1 < Cr/Fe < 3 | A | A |
| Example 26 | 0.10% | 4 | 2 | 1 | 3 | 1 | 7 | 3 | 10 | 1 < Cr/Fe < 3 | A | A |
| Example 27 | 0.10% | 4 | 2 | 1 | 3 | 1 | 7 | 3 | 9 | 1 < Cr/Fe < 3 | A | A |

TABLE 2-continued

| | | | | | | | | | | | | |
|---|---|---|---|---|---|---|---|---|---|---|---|---|
| Example 28 | 0.10% | 4 | 2 | 1 | 3 | 1 | 7 | 3 | 10 | 1 < Cr/Fe < 3 | A | A |
| Example 29 | 0.10% | 4 | 2 | 1 | 3 | 1 | 7 | 3 | 10 | 1 < Cr/Fe < 3 | A | A |
| Example 30 | 0.10% | 4 | 2 | 1 | 3 | 1 | 7 | 3 | 10 | 1 < Cr/Fe < 3 | A | A |
| Example 31 | 0.10% | 4 | 2 | 1 | 3 | 1 | 7 | 3 | 10 | 1 < Cr/Fe < 3 | A | A |

TABLE 3

Continued from Table 1

| | Organic solvent | | | Stabilizer before purification | | Stabilizer after purification | | Organic impurity after purification | | Peroxide after purification (mass ppt) |
|---|---|---|---|---|---|---|---|---|---|---|
| | First organic solvent (% by mass) | Second organic solvent (% by mass) | Third organic solvent (% by mass) | First stabilizer (mass ppm) | Second stabilizer (mass ppm) | First stabilizer (mass ppm) | Second stabilizer (mass ppm) | Type | Content (mass ppm) | |
| Example 32 | PGMEA | PGME 30 wt % | — | BHT 3 ppm | — | BHT 3 ppm | — | Propylene glycol | 1,000 ppm | 5 |
| Example 33 | PGME | PGMEA 30% | — | BHT 3 ppm | — | BHT 3 ppm | — | Propylene glycol | 1,000 ppm | 5 |
| Example 34 | PGMEA | γ-BL 30 wt % | — | BHT 3 ppm | — | BHT 3 ppm | — | Propylene glycol | 1,000 ppm | 5 |
| Example 35 | PGMEA | CyHx 30 wt % | — | BHT 3 ppm | — | BHT 3 ppm | — | Propylene glycol | 1,000 ppm | 5 |
| Example 36 | PGMEA | EL 30 wt % | — | BHT 3 ppm | — | BHT 3 ppm | — | Propylene glycol | 1,000 ppm | 5 |
| Example 37 | PGMEA | EL 30 wt % | — | BHT 3 ppm | — | BHT 3 ppm | — | Propylene glycol | 1,000 ppm | 5 |
| Example 38 | PGMEA | EL 20 wt % | CyHx 20 wt % | BHT 3 ppm | — | BHT 3 ppm | — | Propylene glycol | 1,000 ppm | 5 |
| Example 39 | PGMEA | — | — | BHT 3 ppm | — | BHT 3 ppm | — | Propylene glycol | 1,000 ppm | 5 |
| Example 40 | PGMEA | — | — | BHT 3 ppm | — | BHT 3 ppm | — | Propylene glycol | 1,000 ppm | 5 |
| Example 41 | PGMEA | — | — | BHT 3 ppm | — | BHT 3 ppm | — | Propylene glycol | 1,000 ppm | 5 |
| Example 42 | PGMEA | — | — | BHT 3 ppm | — | BHT 3 ppm | — | Propylene glycol | 0.5 ppm | 5 |
| Example 43 | PGMEA | — | — | BHT 3 ppm | — | BHT 3 ppm | — | Propylene glycol | 1,000 ppm | 5 |
| Example 44 | PGMEA | — | — | BHT 3 ppm | — | BHT 3 ppm | — | Propylene glycol | 1,000 ppm | 5 |
| Example 45 | PGMEA | — | — | BHT 3 ppm | — | BHT 3 ppm | — | Propylene glycol | 1,000 ppm | 0.005 |
| Example 46 | PGMEA | — | — | BHT 3 ppm | DLTP 3 ppm | BHT 3 ppm | DLTP 3 ppm | Propylene glycol | 1,000 ppm | 5 |
| Example 47 | PGMEA | — | — | EDTA 3 ppm | DHEG 3 ppm | EDTA 3 ppm | DHEG 3 ppm | Propylene glycol | 1,000 ppm | 5 |
| Example 48 | PGMEA | — | — | BHT 0 ppm | — | BHT 3 ppm | — | Propylene glycol | 1,000 ppm | 5 |
| Example 49 | PGMEA | — | — | DLTP 0 ppm | — | DLTP 5 ppm | — | Propylene glycol | 1,000 ppm | 3 |

Continued from Table 1

| | Moisture after purification (% by mass) | Number of times of ion exchange resin treatment | Metal impurity after purification | | | | | Number of times of ultrafiltraiton treatment | Number of coarse particles after purification (/ml) | Specification of SUS container | Evaluation | |
|---|---|---|---|---|---|---|---|---|---|---|---|---|
| | | | Fe (mass ppt) | Cr (mass ppt) | Ni (mass ppt) | Pb (mass ppt) | Total (mass ppt) | | | | Defect inhibition properties | Stability of solution |
| Example 32 | 0.10% | 4 | 2 | 1 | 3 | 1 | 7 | 3 | 10 | 1 < Cr/Fe < 3 | A | A |
| Example 33 | 0.10% | 4 | 2 | 1 | 3 | 1 | 7 | 3 | 10 | 1 < Cr/Fe < 3 | A | A |
| Example 34 | 0.10% | 4 | 2 | 1 | 3 | 1 | 7 | 3 | 10 | 1 < Cr/Fe < 3 | A | A |

TABLE 3-continued

| | | | | | | | | | | | | |
|---|---|---|---|---|---|---|---|---|---|---|---|---|
| Example 35 | 0.10% | 4 | 2 | 1 | 3 | 1 | 7 | 3 | 10 | 1 < Cr/Fe < 3 | A | A |
| Example 36 | 0.10% | 4 | 2 | 1 | 3 | 1 | 7 | 3 | 10 | 1 < Cr/Fe < 3 | A | A |
| Example 37 | 0.10% | 4 | 2 | 1 | 3 | 1 | 7 | 3 | 10 | 1 < Cr/Fe < 3 | A | A |
| Example 38 | 0.10% | 4 | 2 | 1 | 3 | 1 | 7 | 3 | 10 | 1 < Cr/Fe < 3 | A | A |
| Example 39 | 0.10% | 4 | 2 | 1 | 3 | 1 | 7 | 3 | 10 | Cr/Fe < 1 | A | B |
| Example 40 | 0.10% | 4 | 2 | 1 | 3 | 1 | 7 | 3 | 10 | 3 < Cr/Fe | C | A |
| Example 41 | 0.10% | 10 | 0.02 | 0.01 | 0.02 | 0.01 | 0.06 | 3 | 8 | 1 < Cr/Fe < 3 | C | A |
| Example 42 | 0.10% | 4 | 2 | 1 | 3 | 1 | 7 | 3 | 9 | 1 < Cr/Fe < 3 | A | A |
| Example 43 | 0.005% | 4 | 2 | 1 | 3 | 1 | 7 | 3 | 10 | 1 < Cr/Fe < 3 | A | A |
| Example 44 | 2.00% | 4 | 2 | 1 | 3 | 1 | 7 | 3 | 10 | 1 < Cr/Fe < 3 | B | A |
| Example 45 | 0.10% | 4 | 2 | 1 | 3 | 1 | 7 | 3 | 10 | 1 < Cr/Fe < 3 | A | A |
| Example 46 | 0.10% | 4 | 2 | 1 | 3 | 1 | 7 | 3 | 10 | 1 < Cr/Fe < 3 | B | A |
| Example 47 | 0.10% | 4 | 2 | 1 | 3 | 1 | 7 | 3 | 10 | 1 < Cr/Fe < 3 | B | B |
| Example 48 | 0.10% | 4 | 3 | 1 | 2 | 1 | 7 | 3 | 9 | 1 < Cr/Fe < 3 | AA | A |
| Example 49 | 0.10% | 4 | 2 | 1 | 4 | 2 | 9 | 3 | 10 | 1 < Cr/Fe < 3 | B | A |

TABLE 4

Continued from Table 1

| | Organic solvent | | | Stabilizer before purification | | Stabilizer after purification | | Organic impurity after purification | | Peroxide after purification (mass ppt) |
|---|---|---|---|---|---|---|---|---|---|---|
| | First organic solvent (% by mass) | Second organic solvent (% by mass) | Third organic solvent (% by mass) | First stabilizer (mass ppm) | Second stabilizer (mass ppm) | First stabilizer (mass ppm) | Second stabilizer (mass ppm) | Type | Content (mass ppm) | |
| Example 50 | PGMEA | — | — | DTPA 3 ppm | — | DTPA 3 ppm | — | Propylene glycol | 1,000 ppm | 10 |
| Example 51 | PGMEA | — | — | CA 3 ppm | — | CA 3 ppm | — | Propylene glycol | 1,000 ppm | 10 |
| Example 52 | PGMEA | — | — | Gallic Acid 3 ppm | — | Gallic Acid 3 ppm | — | Propylene glycol | 1,000 ppm | 10 |
| Example 53 | PGMEA | — | — | BHT 3 ppm | EDTA 3 ppm | BHT 3 ppm | EDTA 3 ppm | Propylene glycol | 1,000 ppm | 5 |
| Example 54 | PGMEA | — | — | EDTP 3 ppm | — | EDTP 3 ppm | — | Propylene glycol | 1,000 ppm | 10 |
| Example 55 | PGMEA | PC 10 wt % | — | BHT 3 ppm | — | BHT 3 ppm | — | Propylene glycol | 1,000 ppm | 5 |
| Example 56 | PGMEA | MMP 40 wt % | — | BHT 3 ppm | — | BHT 3 ppm | — | Propylene glycol | 1,000 ppm | 5 |
| Example 57 | nBA | MIBC 3 wt % | — | BHT 3 ppm | — | BHT 3 ppm | — | 1-Butanol | 1,000 ppm | 5 |
| Example 58 | PGMEA | — | — | DTPA 3 ppm | — | DTPA 3 ppm | — | Propylene glycol | 1,000 ppm | 10 |
| Example 59 | PGMEA | — | — | HQ 3 ppm | — | HQ 3 ppm | — | Propylene glycol | 1,000 ppm | 8 |
| Example 60 | PGMEA | — | — | BHA 3 ppm | — | BHA 3 ppm | — | Propylene glycol | 1,000 ppm | 5 |
| Example 61 | PGMEA | — | — | tEHP 3 ppm | — | tEHP 3 ppm | — | Propylene glycol | 1,000 ppm | 7 |
| Example 62 | PGMEA | — | — | HMBP 3 ppm | — | HMBP 3 ppm | — | Propylene glycol | 1,000 ppm | 7 |
| Example 63 | PGMEA | — | — | BHT 3 ppm | DTPA 3 ppm | BHT 3 ppm | DTPA 3 ppm | Propylene glycol | 1,000 ppm | 5 |
| Example 64 | PGMEA | — | — | MBF 5 ppm | EDTA 3 ppm | MBF 5 ppm | EDTA 3 ppm | Propylene glycol | 1,001 ppm | 5 |
| Example 65 | PGMEA | — | — | DSTP 5 ppm | EDTA 3 ppm | DSTP 5 ppm | EDTA 3 ppm | Propylene glycol | 1,001 ppm | 5 |

TABLE 4-continued

| Example 66 | PGMEA | — | — | BHT 3 ppm | — | BHT 3 ppm | — | Propylene glycol | 0.001 ppm | 5 |
| Comparative Example 1 | PGMEA | — | — | BHT 55 ppm | — | BHT 55 ppm | — | Propylene glycol | 1,000 ppm | 1 |
| Comparative Example 2 | PGMEA | — | — | BHT 0.05 ppm | — | BHT 0.05 ppm | — | Propylene glycol | 1,000 ppm | 20 |

Continued from Table 1

| | Moisture after purification (% by mass) | Number of times of ion exchange resin treatment | Metal impurity after purification | | | | Number of times of ultrafiltraiton treatment | Number of coarse particles after purification (/ml) | Specification of SUS container | Evaluation | |
| | | | Fe (mass ppt) | Cr (mass ppt) | Ni (mass ppt) | Pb (mass ppt) | Total (mass ppt) | | | | Defect inhibition properties | Stability of solution |
|---|---|---|---|---|---|---|---|---|---|---|---|---|
| Example 50 | 0.10% | 4 | 2 | 2 | 2 | 1 | 7 | 3 | 11 | 1 < Cr/Fe < 3 | B | B |
| Example 51 | 0.10% | 4 | 2 | 2 | 2 | 1 | 7 | 3 | 11 | 1 < Cr/Fe < 3 | B | B |
| Example 52 | 0.10% | 4 | 2 | 2 | 2 | 1 | 7 | 3 | 11 | 1 < Cr/Fe < 3 | B | B |
| Example 53 | 0.10% | 4 | 2 | 1 | 1 | 1 | 5 | 3 | 11 | 1 < Cr/Fe < 3 | AA | A |
| Example 54 | 0.10% | 4 | 2 | 2 | 2 | 1 | 7 | 3 | 11 | 1 < Cr/Fe < 3 | B | B |
| Example 55 | 0.10% | 4 | 2 | 1 | 3 | 1 | 7 | 3 | 10 | 1 < Cr/Fe < 3 | A | A |
| Example 56 | 0.10% | 4 | 2 | 1 | 3 | 1 | 7 | 3 | 10 | 1 < Cr/Fe < 3 | A | A |
| Example 57 | 0.10% | 4 | 2 | 1 | 3 | 1 | 7 | 3 | 10 | 1 < Cr/Fe < 3 | A | A |
| Example 58 | 0.10% | 4 | 2 | 2 | 2 | 1 | 7 | 3 | 10 | 1 < Cr/Fe < 3 | B | B |
| Example 59 | 0.10% | 4 | 2 | 1 | 3 | 1 | 7 | 3 | 10 | 1 < Cr/Fe < 3 | AA | A |
| Example 60 | 0.10% | 4 | 2 | 1 | 3 | 1 | 7 | 3 | 10 | 1 < Cr/Fe < 3 | AA | A |
| Example 61 | 0.10% | 4 | 2 | 2 | 2 | 1 | 7 | 3 | 10 | 1 < Cr/Fe < 3 | A | A |
| Example 62 | 0.10% | 4 | 2 | 2 | 2 | 1 | 7 | 3 | 10 | 1 < Cr/Fe < 3 | AA | A |
| Example 63 | 0.10% | 4 | 2 | 1 | 1 | 1 | 5 | 3 | 10 | 1 < Cr/Fe < 3 | AA | A |
| Example 64 | 0.10% | 4 | 2 | 1 | 1 | 1 | 5 | 3 | 10 | 1 < Cr/Fe < 4 | AA | A |
| Example 65 | 0.10% | 4 | 2 | 1 | 1 | 1 | 5 | 3 | 10 | 1 < Cr/Fe < 4 | B | A |
| Example 66 | 0.10% | 4 | 2 | 1 | 3 | 1 | 7 | 3 | 9 | 1 < Cr/Fe < 3 | B | A |
| Comparative Example 1 | 0.10% | 4 | 2 | 1 | 3 | 1 | 7 | 3 | 10 | — | D | A |
| Comparative Example 2 | 0.10% | 4 | 2 | 1 | 3 | 1 | 7 | 3 | 10 | — | B | C |

It was confirmed that the solutions of examples shown in Table 1 had excellent defect inhibition properties and were excellent in the stability of the organic solvent contained in the solutions (temporal decomposition of the organic solvent was inhibited).

By the comparison of Examples 1 and 11 to 13, it was confirmed that in a case where the content of the stabilizer with respect to the total mass of the solution was 0.1 to 30 mass ppm (more preferably 0.1 to 15 mass ppm), the defect inhibition properties were further improved.

By the comparison of Examples 1, 14 to 20, 46 to 54, and 58 to 62, it was confirmed that in a case where an antioxidant was used as a stabilizer, the temporal stability of the organic solvent in the solution was further improved.

Furthermore, it was confirmed that in a case where the boiling point of the antioxidant was 150° C. to 500° C. (preferably 150° C. to 400° C.), the defect inhibition properties were further improved.

By the comparison of Examples 1 to 5 and 41, it was confirmed that in a case where the total content of the metal components (metal impurities; Fe, Cr, Ni, and Pb) with respect to the total mass of the solution was 0.1 to 1,000 mass ppt, the defect inhibition properties were further improved. Particularly, it was confirmed that in a case where the total content of the metal components (metal impurities; Fe, Cr, Ni, and Pb) with respect to the total mass of the solution was 0.1 to 500 mass ppt, (more preferably in a case where the total content of the metal components with respect to the total mass of the solution was 0.1 to 12 mass ppt), the defect inhibition properties were further improved, and the temporal stability of the organic solvent in the solution was further improved.

By the comparison of Examples 1, 6, 7, 42, and 66, it was confirmed that in a case where the content of the organic impurity with respect to the total mass of the solution was 0.1 to 10,000 mass ppm (preferably in a case where the content of the organic impurity was 1 to 10,000 mass ppm), the defect inhibition properties were further improved, and the temporal stability of the organic solvent in the solution was further improved.

By the comparison of Examples 1 and 8 to 10, it was confirmed that in a case where the number of objects to be counted (number of coarse particles), which were counted by a light scattering-type liquid-borne particle counter and had a size equal to or greater than 0.1 μm, in 1 mL of the solution was equal to or smaller than 100, the defect inhibition properties were further improved, and the temporal stability of the organic solvent in the solution was further improved.

By the comparison of Examples 1, 43, and 44, it was confirmed that in a case where the content of water with respect to the total mass of the solution was 0.01% to 1.0% by mass, the defect inhibition properties were further improved.

By the comparison between Examples 1 and 45, it was confirmed that in a case where the content of the peroxide with respect to the total mass of the solution was 0.01 to 10 mass ppm, the defect inhibition properties were further improved, and the temporal stability of the organic solvent in the solution was further improved.

By the comparison of Examples 1, 39, and 40, it was confirmed that in a case where a container, in which the Cr/Fe ratio within the surface of stainless steel constituting the inner wall thereof satisfied 1<Cr/Fe<3 in terms of an at % ratio, was used as a storage container of the solution, the defect inhibition properties were further improved, and the temporal stability of the organic solvent in the solution was further improved.

The defect inhibition properties of the solution of Comparative Example 1 did not meet the desired requirement.

Furthermore, regarding the solution of Comparative Example 2, the stability of the organic solvent contained in the solution was poor.

Example 67

The solution of Example 3 was filtered once by using a microfiltration membrane having a pore size equal to or smaller than 20 nm (trade name: "TORRENTO ATE DISPOSABLE FILTER", manufactured by Entegris, Inc.). Then, as in Example 3, the obtained solution of Example 67 was stored in a container whose inner wall as a solution contact portion was formed of stainless steel. The Cr/Fe ratio within the surface of the stainless steel (surface contacting the solution) constituting the solution contact portion satisfied 1<Cr/Fe<3 in terms of an at % ratio.

The obtained solution was measured by the same method as that in Example 3 so as to evaluate the defect inhibition properties and the stability of the solution.

The results are shown in table 2.

Examples 68 and 69

By using the solution of Example 3, Example 68 (filtering: twice) and Example 69 (filtering: three times) were obtained by the same method as that described above, except that the number of times of filtering was changed. Then, in the same manner as in Example 3, each of the obtained solutions of Example 68 and Example 69 was stored in a container whose inner wall as a solution contact portion was formed of stainless steel. The Cr/Fe ratio within the surface of the stainless steel (surface contacting the solution) constituting the solution contact portion satisfied 1<Cr/Fe<3 in terms of an at % ratio.

The obtained solutions were measured by the same method as that in Example 3 so as to evaluate the defect inhibition properties and the stability of the solutions.

The results are shown in Table 2.

Example 70

The solution of Example 3 was filtered once by using a microfiltration membrane having a pore size equal to or smaller than 20 nm (trade name: "TORRENTO ATE DISPOSABLE FILTER", manufactured by Entegris, Inc.). Then, the solution was filtered once by using "P-NYLON FILTER (pore size: 0.02 μm, critical surface tension: 77 mN/m)" made of polyamide; (manufactured by Pall Corporation Japan). Thereafter, in the same manner as in Example 3, the obtained solution of Example 70 was stored in a container whose inner wall as a solution contact portion was formed of stainless steel. The Cr/Fe ratio within the surface of the stainless steel (surface contacting the solution) constituting the solution contact portion satisfied 1<Cr/Fe<3 in terms of an at % ratio.

The obtained solution was measured by the same method as that in Example 3 so as to evaluate the defect inhibition properties and the stability of the solutions.

Example 3 shown in Table 2 is the same as Example 3 shown in Table 1 (the columns of "Number of times of ion exchange resin treatment" and "Number of times of ultrafiltration treatment" are not shown in Table 2).

TABLE 5

Table 2

| | Organic solvent | | | Stabilizer before purification | | Stabilizer after purification | | Organic impurity | | Peroxide after purification (mass ppt) |
| | First organic solvent (% by mass) | Second organic solvent (% by mass) | Third organic solvent (% by mass) | First stabilizer (mass ppm) | Second stabilizer (mass ppm) | First stabilizer (mass ppm) | Second stabilizer (mass ppm) | Type | Content (mass ppm) | |
|---|---|---|---|---|---|---|---|---|---|---|
| Example 3 | PGMEA | — | — | BHT 3 ppm | — | BHT 3 ppm | — | Propylene glycol | 1,000 ppm | 5 |
| Example 67 | PGMEA | — | — | BHT 3 ppm | — | BHT 3 ppm | — | Propylene glycol | 1,000 ppm | 5 |
| Example 68 | PGMEA | — | — | BHT 3 ppm | — | BHT 3 ppm | — | Propylene glycol | 1,000 ppm | 5 |

TABLE 5-continued

| | | | | | | | | | | |
|---|---|---|---|---|---|---|---|---|---|---|
| Example 69 | PGMEA | — | — | BHT 3 ppm | — | BHT 3 ppm | — | Propylene glycol | 1,000 ppm | 6 |
| Example 70 | PGMEA | — | — | BHT 3 ppm | — | BHT 3 ppm | — | Propylene glycol | 1,000 ppm | 5 |

Table 2

| | Moisture after purification (% by mass) | Metal impurity after purification | | | | | Number of times of polyethylene filtering | Number of times of nylon filtering | Number of coarse particles after purification (/ml) | Specification of SUS container | Evaluation | |
|---|---|---|---|---|---|---|---|---|---|---|---|---|
| | | Fe (mass ppt) | Cr (mass ppt) | Ni (mass ppt) | Pb (mass ppt) | Total (mass ppt) | | | | | Defect inhibition properties | Stability of solution |
| Example 3 | 0.10% | 20 | 10 | 26 | 8 | 64 | 0 | 0 | 10 | 1 < Cr/Fe < 3 | A | A |
| Example 67 | 0.10% | 13 | 6 | 15 | 6 | 40 | 1 | 0 | 10 | 1 < Cr/Fe < 3 | A | A |
| Example 68 | 0.10% | 4 | 2 | 5 | 2 | 13 | 2 | 0 | 10 | 1 < Cr/Fe < 3 | A | A |
| Example 69 | 0.10% | 3 | 1 | 2 | 1 | 7 | 3 | 0 | 9 | 1 < Cr/Fe < 3 | AA | A |
| Example 70 | 0.10% | 3 | 2 | 2 | 1 | 8 | 1 | 1 | 10 | 1 < Cr/Fe < 3 | AA | A |

As is evident from Table 2, in a case where the purification step included filtering performed using a microfiltration membrane having a pore size equal to or smaller than 20 nm, the amount of metal impurities in the solution could be markedly reduced. Particularly, it was confirmed that in a case where the filtering using the aforementioned filter was performed three or more times, it was possible to reduce not only the amount of metal impurities in the solution but also the number of objects to be counted (number of coarse particles) which were counted by a light scattering-type liquid-borne particle counter and had a size equal to or greater than 0.1 µm, in 1 mL of the solution, and accordingly, the defect performance was further improved.

Furthermore, it was confirmed that in a case where the filtering performed using the microfiltration membrane having a pore size equal to or smaller than 20 nm was combined with the filtering using nylon, the amount of metal impurities in the solution could be more efficiently reduced.

Example 71

The solution of Example 29 was filtered once by using a microfiltration membrane having a pore size equal to or smaller than 20 nm (trade name: "TORRENTO ATE DISPOSABLE FILTER", manufactured by Entegris, Inc.). Then, as in Example 29, the obtained solution of Example 71 was stored in a container whose inner wall as a solution contact portion was formed of stainless steel. The Cr/Fe ratio within the surface of the stainless steel (surface contacting the solution) constituting the solution contact portion satisfied 1<Cr/Fe<3 in terms of an at % ratio.

The obtained solution was measured by the same method as that in Example 29 so as to evaluate the defect inhibition properties and the stability of the solution.

The results are shown in table 3.

Example 72

The solution of Example 29 was filtered once by using a microfiltration membrane having a pore size equal to or smaller than 20 nm (trade name: "TORRENTO ATE DISPOSABLE FILTER", manufactured by Entegris, Inc.). Then, the solution was filtered once by using "P-NYLON FILTER (pore size: 0.02 µm, critical surface tension: 77 mN/m)" made of polyamide; (manufactured by Pall Corporation Japan). Thereafter, in the same manner as in Example 29, the obtained solution of Example 72 was stored in a container whose inner wall as a solution contact portion was formed of stainless steel. The Cr/Fe ratio within the surface of the stainless steel (surface contacting the solution) constituting the solution contact portion satisfied 1<Cr/Fe<3 in terms of an at % ratio.

The obtained solution was measured by the same method as that in Example 29 so as to evaluate the defect inhibition properties and the stability of the solutions.

Example 29 shown in Table 3 is the same as Example 29 shown in Table 1 (the columns of "Number of times of ion exchange resin treatment" and "Number of times of ultrafiltration treatment" are not shown in Table 3).

TABLE 6

Table 3

| | Organic solvent | | | Stabilizer before purification | | Stabilizer after purification | | Organic impurity | | Peroxide after purification (mass ppt) |
|---|---|---|---|---|---|---|---|---|---|---|
| | First organic solvent (% by mass) | Second organic solvent (% by mass) | Third organic solvent (% by mass) | First stabilizer (mass ppm) | Second stabilizer (mass ppm) | First stabilizer (mass ppm) | Second stabilizer (mass ppm) | Type | Content (mass ppm) | |
| Example 29 | MIBC | — | — | BHT 3 ppm | — | BHT 3 ppm | — | 1-Methyl-butanol | 1,000 ppm | 10 |

TABLE 6-continued

| | | | | | | | | | | |
|---|---|---|---|---|---|---|---|---|---|---|
| Example 71 | MIBC | — | — | BHT 3 ppm | — | BHT 3 ppm | — | 1-Methyl-butanol | 1,000 ppm | 10 |
| Example 72 | MIBC | — | — | BHT 3 ppm | — | BHT 3 ppm | — | 1-Methyl-butanol | 1,000 ppm | 10 |

Table 3

| | Moisture after purification (% by mass) | Metal impurity after purification | | | | | Number of times of polyethylene filtering | Number of times of nylon filtering | Number of coarse particles after purification (/ml) | Specification of SUS container | Evaluation | |
|---|---|---|---|---|---|---|---|---|---|---|---|---|
| | | Fe (mass ppt) | Cr (mass ppt) | Ni (mass ppt) | Pb (mass ppt) | Total (mass ppt) | | | | | Defect inhibition properties | Stability of solution |
| Example 29 | 0.10% | 2 | 1 | 3 | 1 | 7 | 0 | 0 | 10 | 1 < Cr/Fe < 3 | A | A |
| Example 71 | 0.10% | 1 | 1 | 2 | 1 | 5 | 1 | 0 | 10 | 1 < Cr/Fe < 3 | A | AA |
| Example 72 | 0.10% | 1 | 1 | 1 | 1 | 4 | 1 | 1 | 5 | 1 < Cr/Fe < 3 | AA | AA |

From Table 3, it was confirmed that in a case where the filtering performed using the microfiltration membrane having a pore size equal to or smaller than 20 nm was combined with the filtering using nylon in the purification step, the amount of metal impurities in the solution could be more efficiently reduced.

Example 73

The solution of Example 28 was filtered once by using a microfiltration membrane having a pore size equal to or smaller than 20 nm (trade name: "TORRENTO ATE DISPOSABLE FILTER", manufactured by Entegris, Inc.). Then, as in Example 28, the obtained solution of Example 73 was stored in a container whose inner wall as a solution contact portion was formed of stainless steel. The Cr/Fe ratio within the surface of the stainless steel (surface contacting the solution) constituting the solution contact portion satisfied 1<Cr/Fe<3 in terms of an at % ratio.

The obtained solution was measured by the same method as that in Example 28 so as to evaluate the defect inhibition properties and the stability of the solution.

The results are shown in table 4.

Example 74

The solution of Example 28 was filtered once by using a microfiltration membrane having a pore size equal to or smaller than 20 nm (trade name: "TORRENTO ATE DISPOSABLE FILTER", manufactured by Entegris, Inc.). Then, the solution was filtered once by using "P-NYLON FILTER (pore size: 0.02 μm, critical surface tension: 77 mN/m)" made of polyamide; (manufactured by Pall Corporation Japan). Thereafter, in the same manner as in Example 28, the obtained solution of Example 74 was stored in a container whose inner wall as a solution contact portion was formed of stainless steel. The Cr/Fe ratio within the surface of the stainless steel (surface contacting the solution) constituting the solution contact portion satisfied 1<Cr/Fe<3 in terms of an at % ratio.

The obtained solution was measured by the same method as that in Example 28 so as to evaluate the defect inhibition properties and the stability of the solutions.

Example 28 shown in Table 4 is the same as Example 28 shown in Table 1 (the columns of "Number of times of ion exchange resin treatment" and "Number of times of ultrafiltration treatment" are not shown in Table 4).

TABLE 7

Table 4

| | Organic solvent | | | Stabilizer before purification | | Stabilizer after purification | | Organic impurity | | Peroxide after purification (mass ppt) |
|---|---|---|---|---|---|---|---|---|---|---|
| | First organic solvent (% by mass) | Second organic solvent (% by mass) | Third organic solvent (% by mass) | First stabilizer (mass ppm) | Second stabilizer (mass ppm) | First stabilizer (mass ppm) | Second stabilizer (mass ppm) | Type | Content (mass ppm) | |
| Example 28 | nBA | — | — | BHT 3 ppm | — | BHT 3 ppm | — | 1-Butanol | 1,000 ppm | 10 |
| Example 73 | nBA | — | — | BHT 3 ppm | — | BHT 3 ppm | — | 1-Butanol | 1,000 ppm | 10 |
| Example 74 | nBA | — | — | BHT 3 ppm | — | BHT 3 ppm | — | 1-Butanol | 1,000 ppm | 10 |

TABLE 7-continued

Table 4

| | Moisture after purification (% by mass) | Metal impurity after purification | | | | | Number of times of polyethylene filtering | Number of times of nylon filtering | Number of coarse particles after purification (/ml) | Specification of SUS container | Evaluation | |
|---|---|---|---|---|---|---|---|---|---|---|---|---|
| | | Fe (mass ppt) | Cr (mass ppt) | Ni (mass ppt) | Pb (mass ppt) | Total (mass ppt) | | | | | Defect inhibition properties | Stability of solution |
| Example 28 | 0.10% | 2 | 1 | 3 | 1 | 7 | 0 | 0 | 10 | 1 < Cr/Fe < 3 | A | A |
| Example 73 | 0.10% | 1 | 1 | 2 | 1 | 5 | 1 | 0 | 10 | 1 < Cr/Fe < 3 | A | AA |
| Example 74 | 0.10% | 1 | 1 | 1 | 1 | 4 | 1 | 1 | 5 | 1 < Cr/Fe < 3 | AA | AA |

From Table 4, it was confirmed that in a case where the filtering performed using the microfiltration membrane having a pore size equal to or smaller than 20 nm was combined with the filtering using nylon in the purification step, the amount of metal impurities in the solution could be more efficiently reduced.

What is claimed is:

1. A solution comprising:
an organic solvent;
a stabilizer; and
an organic impurity,
wherein a content of the stabilizer with respect to a total mass of the solution is 0.1 to 50 mass ppm,
a content of the organic solvent with respect to the total mass of the solution is equal to or greater than 98.00% by mass,
a content of the organic impurity with respect to the total mass of the solution is 0.01 to 10,000 mass ppm, and
the solution satisfies any of the following conditions 1 to 12,
condition 1: the organic solvent is propylene glycol monomethyl ether acetate, the organic impurity is propylene glycol;
condition 2: the organic solvent is propylene glycol monomethyl ether, the organic impurity is methanol;
condition 3: the organic solvent is propylene glycol monoethyl ether, the organic impurity is ethanol;
condition 4: the organic solvent is propylene glycol monopropyl ether, the organic impurity is propanol;
condition 5: the organic solvent is ethyl lactate, the organic impurity is ethanol;
condition 6: the organic solvent is cyclopentanone, the organic impurity is cyclopentanol;
condition 7: the organic solvent is cyclohexanone, the organic impurity is cyclohexanol;
condition 8: the organic solvent is γ-butyrolactone, the organic impurity is hydroxybutyrate;
condition 9: the organic solvent is butyl acetate, the organic impurity is 1-butanol;
condition 10: the organic solvent is 4-methyl-2-pentanol, the organic impurity is 1-methyl butanol;
condition 11: the organic solvent is 1,4-dioxane, the organic impurity is at least one kind of compound selected from the group 1,2-dioxane and 1,3-dioxane; and
condition 12: the organic solvent is tetrahydrofuran, the organic impurity is 1,4-butanediol.

2. The solution according to claim 1 that is used for a semiconductor device manufacturing process.

3. The solution according to claim 1,
wherein a content of a metal component containing an element selected from the group consisting of Fe, Cr, Ni, and Pb with respect to the total mass of the solution is 0.001 to 1,000 mass ppt.

4. The solution according to claim 3,
wherein the content of the metal component containing an element selected from the group consisting of Fe, Cr, Ni, and Pb with respect to the total mass of the solution is 0.1 to 1,000 mass ppt.

5. The solution according to claim 1,
wherein the stabilizer is an antioxidant.

6. The solution according to claim 5,
wherein the antioxidant is at least one kind of compound selected from the group consisting of dibutylhydroxytoluene, hydroquinone, didodecyl 3,3'-thiodipropionate, dioctadecyl 3,3'-thiodipropionate, ditetradecyl 3,3'-thiodipropionate, 4,4'-butylidenebis-(6-t-butyl-3-methylphenol), 2,2'-methylenebis-(4-ethyl-6-t-butylphenol), butylhydroxyanisole, tris (2-ethylhexyl) phosphite, 2-hydroxy-4-methoxybenzophenone, and triisodecyl phosphite.

7. The solution according to claim 5,
wherein a boiling point of the antioxidant is 150° C. to 500° C.

8. The solution according to claim 1,
wherein the number of objects to be counted that are counted by a light scattering-type liquid-borne particle counter and have a size equal to or greater than 0.1 μm is equal to or smaller than 100/mL.

9. The solution according to claim 1,
wherein a content of water with respect to the total mass of the solution is 0.01% to 1.0% by mass.

10. The solution according to claim 1,
wherein a content of a peroxide with respect to the total mass of the solution is 0.01 to 10 mass ppm.

11. The solution according to claim 1 that is used for at least one use selected from a prewet solution, a developer, a rinse solution, and a solvent contained in an actinic ray-sensitive or radiation-sensitive resin composition in a semiconductor device manufacturing process.

12. The solution according to claim 1,
wherein the content of the stabilizer with respect to a total mass of the solution is 0.1 to 3 mass ppm.

13. The solution according to claim 1,
wherein the stabilizer is an antioxidant, and
the antioxidant is at least one kind of compound selected from the group consisting of didodecyl 3,3'-thiodipropionate, dioctadecyl 3,3'-thiodipropionate, ditetradecyl 3,3'-thiodipropionate, 4,4'-butylidenebis-(6-t-butyl-3- methylphenol), 2,2'-methylenebis-(4-ethyl-6-t-butylphenol), butylhydroxyanisole, tris (2-ethylhexyl) phosphite, 2-hydroxy-4-methoxybenzophenone, and triisodecyl phosphite.

14. The solution according to claim 1,
wherein the stabilizer is an antioxidant, and the antioxidant is at least one kind of compound selected from the group consisting of hydroquinone, didodecyl 3,3'-thiodipropionate, dioctadecyl 3,3'-thiodipropionate, ditetradecyl 3,3'-thiodipropionate, 4,4'-butylidenebis-(6-t-butyl-3-methylphenol), 2,2'-methylenebis-(4-ethyl-6-t-butylphenol), tris (2-ethylhexyl) phosphite, 2-hydroxy-4-methoxybenzophenone, and triisodecyl phosphite.

15. The solution according to claim 1,
wherein the solution contains objects to be counted by a light scattering-type liquid-borne particle counter and the number of objects that are counted by the particle counter and having a size equal to or greater than 0.1 μm is 5 to 100 per mL.

16. A solution comprising:
an organic solvent;
a stabilizer; and
an organic impurity,
wherein a content of the stabilizer with respect to a total mass of the solution is 0.1 to 50 mass ppm,
the stabilizer is an antioxidant which is at least one kind of compound selected from the group consisting of dibutylhydroxytoluene, didodecyl 3,3'-thiodipropionate, dioctadecyl 3,3'-thiodipropionate, ditetradecyl 3,3'-thiodipropionate, 4,4'-butylidenebis-(6-t-butyl-3-methylphenol), 2,2'-methylenebis-(4-ethyl-6-t-butylphenol), butylhydroxyanisole, tris (2-ethylhexyl) phosphite, 2-hydroxy-4-methoxybenzophenone, and triisodecyl phosphite, and
a content of the organic impurity with respect to the total mass of the solution is 0.01 to 10,000 mass ppm, and
the solution satisfies any of the following conditions 1 to 9,
condition 1: the organic solvent is propylene glycol monomethyl ether acetate, the organic impurity is propylene glycol;
condition 2: the organic solvent is propylene glycol monomethyl ether, the organic impurity is methanol;
condition 3: the organic solvent is propylene glycol monoethyl ether, the organic impurity is ethanol;
condition 4: the organic solvent is propylene glycol monopropyl ether, the organic impurity is propanol;
condition 5: the organic solvent is ethyl lactate, the organic impurity is ethanol;
condition 6: the organic solvent is butyl acetate, the organic impurity is 1-butanol;
condition 7: the organic solvent is 4-methyl-2-pentanol, the organic impurity is 1-methyl butanol;
condition 8: the organic solvent is 1,4-dioxane, the organic impurity is at least one kind of compound selected from the group 1,2-dioxane and 1,3-dioxane; and
condition 9: the organic solvent is tetrahydrofuran, the organic impurity is 1,4-butanediol.

17. The solution according to claim 16,
wherein a content of water with respect to the total mass of the solution is 0.01% to 1.0% by mass.

18. A solution comprising:
an organic solvent;
a stabilizer; and
an organic impurity,
wherein a content of the stabilizer with respect to a total mass of the solution is 0.1 to 50 mass ppm,
a content of the organic solvent with respect to the total mass of the solution is equal to or greater than 98.00% by mass,
a content of the organic impurity with respect to the total mass of the solution is 0.01 to 10,000 mass ppm, and
the solution satisfies any of the following conditions 1 to 11,
condition 1: the organic solvent is propylene glycol monomethyl ether acetate, the organic impurity is propylene glycol;
condition 2: the organic solvent is propylene glycol monomethyl ether, the organic impurity is methanol;
condition 3: the organic solvent is propylene glycol monoethyl ether, the organic impurity is ethanol;
condition 4: the organic solvent is propylene glycol monopropyl ether, the organic impurity is propanol;
condition 5: the organic solvent is ethyl lactate, the organic impurity is ethanol;
condition 6: the organic solvent is cyclopentanone, the organic impurity is cyclopentanol;
condition 7: the organic solvent is cyclohexanone, the organic impurity is cyclohexanol;
condition 8: the organic solvent is butyl acetate, the organic impurity is 1-butanol;
condition 9: the organic solvent is 4-methyl-2-pentanol, the organic impurity is 1-methyl butanol;
condition 10: the organic solvent is 1,4-dioxane, the organic impurity is at least one kind of compound selected from the group 1,2-dioxane and 1,3-dioxane; and
condition 11: the organic solvent is tetrahydrofuran, the organic impurity is 1,4-butanediol.

19. A solution comprising:
an organic solvent;
a stabilizer;
a peroxide; and
an organic impurity,
wherein a content of the stabilizer with respect to a total mass of the solution is 0.1 to 50 mass ppm,
a content of a peroxide with respect to the total mass of the solution is 0.01 to 10 mass ppm,
a content of the organic impurity with respect to the total mass of the solution is 0.01 to 10,000 mass ppm, and
the solution satisfies any of the following conditions 1 to 10,
condition 1: the organic solvent is propylene glycol monomethyl ether acetate, the organic impurity is propylene glycol;
condition 2: the organic solvent is propylene glycol monomethyl ether, the organic impurity is methanol;
condition 3: the organic solvent is propylene glycol monoethyl ether, the organic impurity is ethanol;
condition 4: the organic solvent is propylene glycol monopropyl ether, the organic impurity is propanol;
condition 5: the organic solvent is ethyl lactate, the organic impurity is ethanol;
condition 6: the organic solvent is γ-butyrolactone, the organic impurity is hydroxybutyrate;
condition 7: the organic solvent is butyl acetate, the organic impurity is 1-butanol;
condition 8: the organic solvent is 4-methyl-2-pentanol, the organic impurity is 1-methyl butanol;

condition 9: the organic solvent is 1,4-dioxane, the organic impurity is at least one kind of compound selected from the group 1,2-dioxane and 1,3-dioxane; and condition 10: the organic solvent is tetrahydrofuran, the organic impurity is 1,4-butanediol.

20. The solution according to claim 19, wherein the content of the stabilizer with respect to a total mass of the solution is 0.1 to 3 mass ppm.

21. The solution according to claim 19, wherein the stabilizer is an antioxidant, and the antioxidant is at least one kind of compound selected from the group consisting of didodecyl 3,3'-thiodipropionate, dioctadecyl 3,3'-thiodipropionate, ditetradecyl 3,3'-thiodipropionate, 4,4'-butylidenebis-(6-t-butyl-3-methylphenol), 2,2'-methylenebis-(4-ethyl-6-t-butylphenol), butylhydroxyanisole, tris (2-ethylhexyl) phosphite, 2-hydroxy-4-methoxybenzophenone, and triisodecyl phosphite.

22. A solution comprising:
an organic solvent;
a stabilizer; and
an organic impurity,
wherein a content of the stabilizer with respect to a total mass of the solution is 0.1 to 50 mass ppm,
the number of objects to be counted that are counted by a light scattering-type liquid-borne particle counter and have a size equal to or greater than 0.1 um is equal to or smaller than 100/mL,
a content of the organic impurity with respect to the total mass of the solution is 0.01 to 10,000 mass ppm, and the solution satisfies any of the following conditions 1 to 12, condition 1: the organic solvent is propylene glycol monomethyl ether acetate, the organic impurity is propylene glycol;

condition 2: the organic solvent is propylene glycol monomethyl ether, the organic impurity is methanol;

condition 3: the organic solvent is propylene glycol monoethyl ether, the organic impurity is ethanol;

condition 4: the organic solvent is propylene glycol monopropyl ether, the organic impurity is propanol;

condition 5: the organic solvent is ethyl lactate, the organic impurity is ethanol;

condition 6: the organic solvent is cyclopentanone, the organic impurity is cyclopentanol;

condition 7: the organic solvent is cyclohexanone, the organic impurity is cyclohexanol;

condition 8: the organic solvent is y-butyrolactone, the organic impurity is hydroxybutyrate;

condition 9: the organic solvent is butyl acetate, the organic impurity is 1-butanol;

condition 10: the organic solvent is 4-methyl-2-pentanol, the organic impurity is 1-methyl butanol;

condition 11: the organic solvent is 1,4-dioxane, the organic impurity is at least one kind of compound selected from the group 1,2-dioxane and 1,3-dioxane; and condition 12: the organic solvent is tetrahydrofuran, the organic impurity is 1,4-butanediol.

* * * * *